(12) United States Patent
Bae

(10) Patent No.: US 11,152,292 B2
(45) Date of Patent: Oct. 19, 2021

(54) FAN-OUT SEMICONDUCTOR PACKAGE HAVING METAL PATTERN LAYER ELECTRICALLY CONNECTED EMBEDDED SEMICONDUCTOR CHIP AND REDISTRIBUTION LAYER

(71) Applicant: SAMSUNG ELECTRONICS CO., LTD., Suwon-si (KR)

(72) Inventor: Sunghawn Bae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 16/684,936

(22) Filed: Nov. 15, 2019

(65) Prior Publication Data

US 2020/0168537 A1 May 28, 2020

(30) Foreign Application Priority Data

Nov. 26, 2018 (KR) .................... 10-2018-0147488

(51) Int. Cl.
*H01L 23/498* (2006.01)
*H01L 23/31* (2006.01)
*H01L 23/13* (2006.01)

(52) U.S. Cl.
CPC ........ *H01L 23/49822* (2013.01); *H01L 23/13* (2013.01); *H01L 23/3128* (2013.01); *H01L 23/3135* (2013.01); *H01L 23/49816* (2013.01); *H01L 23/49838* (2013.01)

(58) Field of Classification Search
CPC ......... H01L 23/49822; H01L 23/49816; H01L 23/49838; H01L 23/3128; H01L 23/3135; H01L 23/13
See application file for complete search history.

(56) References Cited

U.S. PATENT DOCUMENTS

| 7,041,534 B2 | 5/2006 | Chao et al. | |
| 2013/0292846 A1* | 11/2013 | Lee | H01L 23/49827 257/774 |
| 2015/0108661 A1* | 4/2015 | Vincent | H01L 23/5383 257/777 |
| 2016/0197057 A1* | 7/2016 | Umemoto | H01L 23/5389 257/738 |
| 2017/0358534 A1 | 12/2017 | Kim et al. | |
| 2018/0061794 A1 | 3/2018 | Kim et al. | |
| 2018/0096968 A1* | 4/2018 | Lee | H01L 24/19 |
| 2019/0088603 A1* | 3/2019 | Marimuthu | H01L 21/486 |

FOREIGN PATENT DOCUMENTS

KR  10-2017-0138906 A  12/2017
KR  10-2018-0024834 A  3/2018

* cited by examiner

*Primary Examiner* — Michael Jung
(74) *Attorney, Agent, or Firm* — Sughrue Mion, PLLC

(57) ABSTRACT

The present invention provides a fan-out semiconductor package, and the fan-out semiconductor package includes a semiconductor chip, an encapsulant covering the semiconductor chip, a connection structure disposed below the semiconductor chip and including a redistribution layer, and first and second metal pattern layers disposed on different levels on the semiconductor chip. The first metal pattern layer is to electrically connect to an electrical connection member such as a frame, provided for electrical connection of the fan-out semiconductor package in a vertical direction through a path via the second metal pattern layer.

20 Claims, 22 Drawing Sheets

FAN-OUT SEMICONDUCTOR PACKAGE HAVING METAL PATTERN LAYER ELECTRICALLY CONNECTED EMBEDDED SEMICONDUCTOR CHIP AND REDISTRIBUTION LAYER

CROSS-REFERENCE TO RELATED APPLICATION

This application claims benefit of priority to Korean Patent Application No. 10-2018-0147488 filed on Nov. 26, 2018 in the Korean Intellectual Property Office, the disclosure of which is incorporated herein by reference in its entirety.

BACKGROUND

The present disclosure relates to a semiconductor package, e.g., a fan-out semiconductor package.

One of main trends in technological development related to semiconductor chips in recent years is to reduce the size of components. Therefore, in the field of packaging, it is necessary to implement a large number of pins having a small size in accordance with a surge of demand for small semiconductor chips and the like. To meet this requirement, one of proposed semiconductor package technologies is a fan-out semiconductor package. The fan-out semiconductor package may redistribute an electrical connection structure beyond an area on which a semiconductor chip is disposed, thereby enabling a large number of pins to be implemented while maintaining a small size.

Meanwhile, recently, in order to improve the electrical characteristics of the premium smartphone product and efficiently utilize space, and to apply a package on package (POP) of a semiconductor package including different semiconductor chips, there is the requirement for forming the backside circuit in a semiconductor package structure. The requirements for the line and space of the backside circuit are increasing in accordance with the demand for the enhancement of the characteristics of the chip and the reduction in the area.

SUMMARY

An aspect of the present disclosure is to provide a fan-out semiconductor package having a backside circuit, yet capable of shortening production time of a product, controlling plating quality of the same, eliminating a limitation to a pretreatment of the same, and thinning a thickness of the same.

An aspect of the present disclosure is to introduce a first metal pattern layer on a backside of a package using a metal film of a detachable carrier, and to introduce a second metal pattern layer on an upper side of the first metal pattern layer by a plating process or the like, wherein the first metal pattern layer is to electrically connect to an electrical connection member such as a frame, provided for electrical connection of the package in a vertical direction through a path via the second metal pattern layer.

According to an aspect of the present disclosure, a fan-out semiconductor package includes a connection structure including one or more redistribution layers; a frame disposed on the connection structure, including one or more wiring layers and having a through-hole portion; a semiconductor chip disposed in the through-hole portion on the connection structure and having a connection pad electrically connected to the one or more redistribution layers; an encapsulant disposed on the connection structure and covering at least a portion of each of the frame and the semiconductor chip; a first metal pattern layer disposed on the encapsulant; an insulating material disposed on the encapsulant and covering the first metal pattern layer; a first opening passing through the insulating material and exposing a portion of the first metal pattern layer; a second opening passing through the encapsulant and the insulating material and exposing a portion of an uppermost wiring layer among the one or more wiring layers; and a second metal pattern layer disposed on the insulating material, and extending to the first and second openings and connected to the exposed first metal pattern layer and the exposed uppermost wiring layer, respectively.

According to another aspect of the present disclosure, a fan-out semiconductor package includes a connection structure including one or more redistribution layers; a semiconductor chip disposed on the connection structure and having connection pads electrically connected to the one or more redistribution layers; an electrical connection member disposed on the connection structure, and electrically connected to the one or more redistribution layer to provide a vertical electrical connection path; an encapsulant disposed on the connection structure and covering at least a portion of each of the semiconductor chip and the electrical connection member; a first metal pattern layer disposed on the encapsulant; an insulating material disposed on the encapsulant and covering the first metal pattern layer; a first opening passing through the insulating material and exposing a portion of the first metal pattern layer; a second opening passing through the encapsulant and the insulating material and exposing a portion of the electrical connection member; and a second metal pattern layer disposed on the insulating material, and extending to the first and second openings and connected to the exposed first metal pattern layer and the exposed electrical connection member, respectively.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
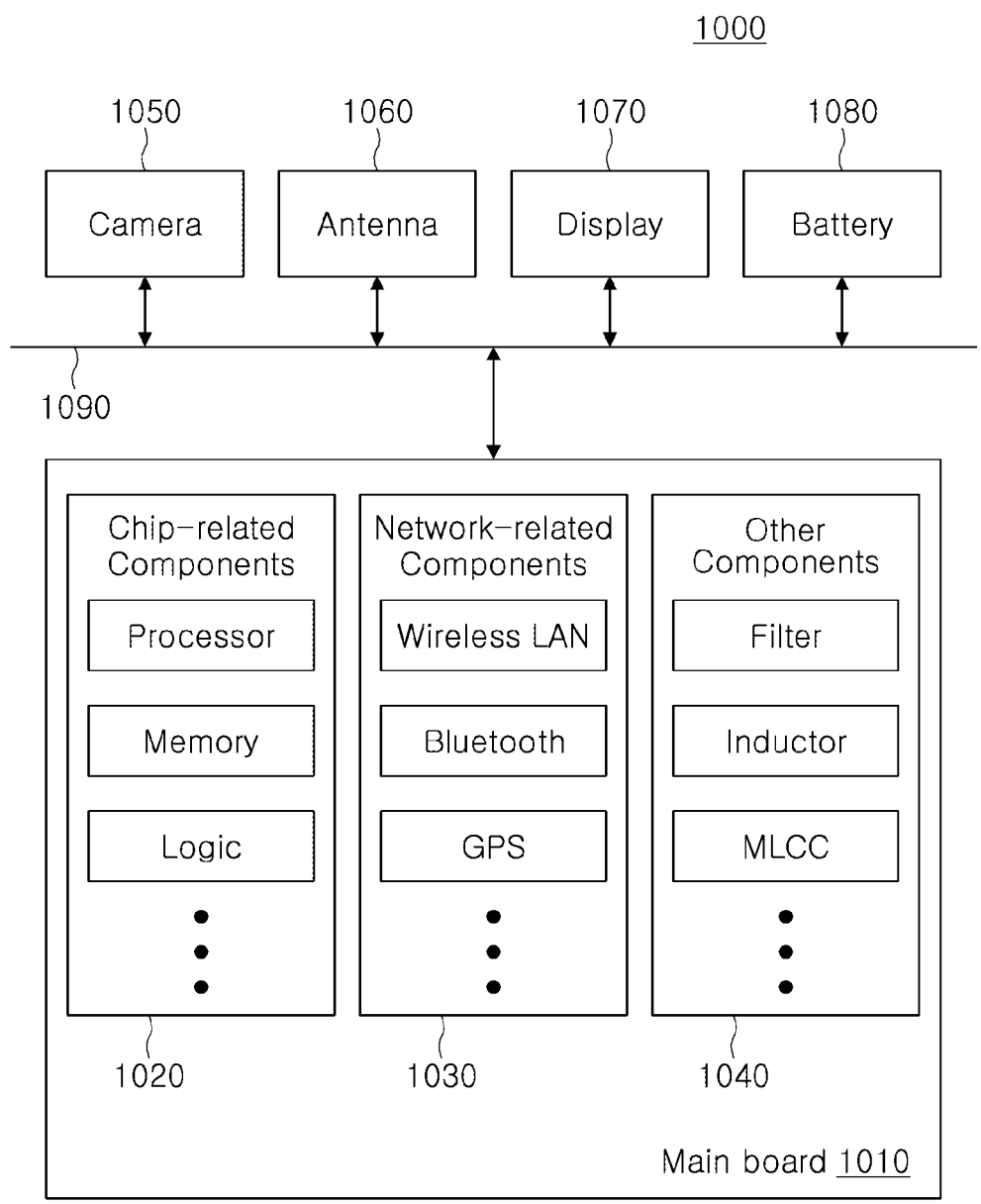
FIG. 1 is a schematic block diagram illustrating an example of an electronic device system.

Hereinafter, embodiments of the present disclosure will be described as follows with reference to the attached drawings. The shape and size of elements in the drawings may be exaggerated or reduced for clarity.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below b y various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include components operated according to protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components operated according to a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
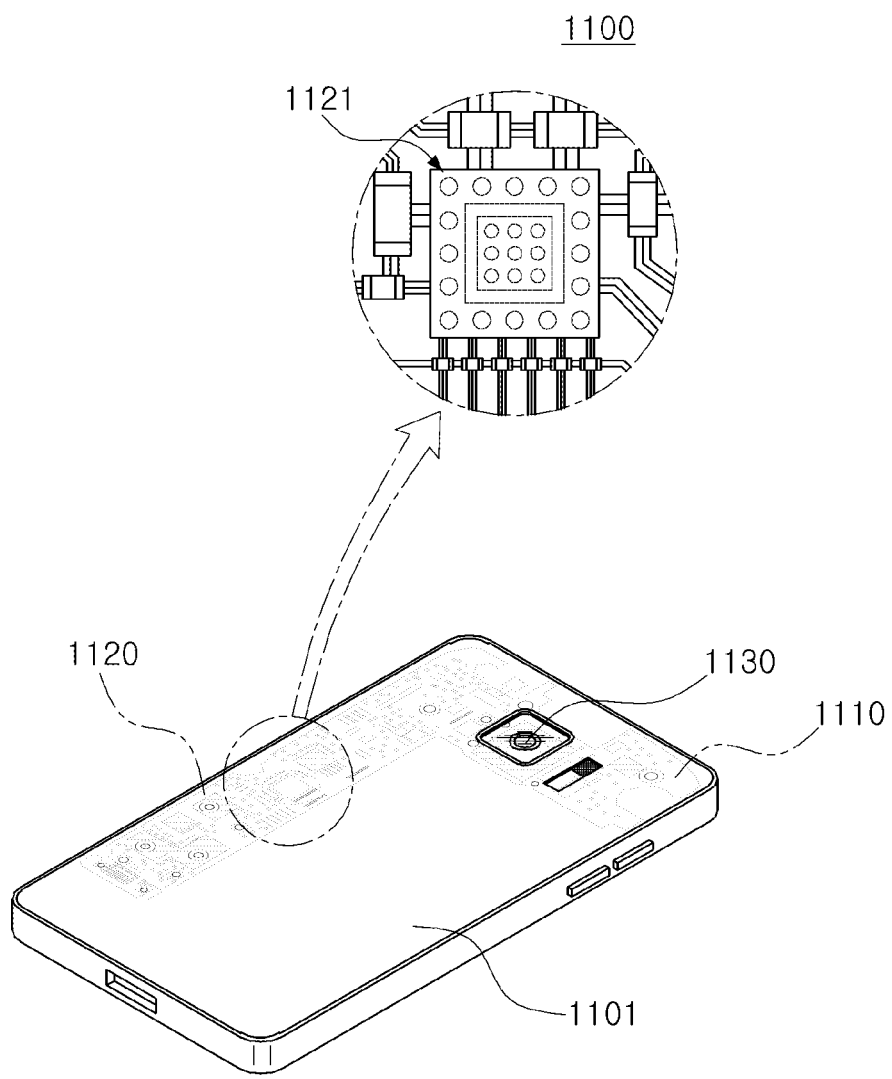
FIG. 2 is a schematic perspective view illustrating an example of an electronic device.

FIG. 2 is a schematic perspective view illustrating an example of an electronic device.

Referring to FIG. 2, a semiconductor package may be applied to various electronic devices as described above for various purposes. For example, a printed circuit board 1110, such as a main board, may be included in a body 1101 of a smartphone 1100. Further, various components 1120 may be physically and/or electrically connected to the printed circuit board 1110. In addition, other components that may or may not be physically and/or electrically connected to the printed circuit board 1110, such as a camera 1130, may be housed within the body 1101. A portion of the components 1120 may be chip-related components, for example, but not limited to, a semiconductor package 1121. The electronic device is not necessarily limited to the smartphone 1100, and may be other electronic device as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package and a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
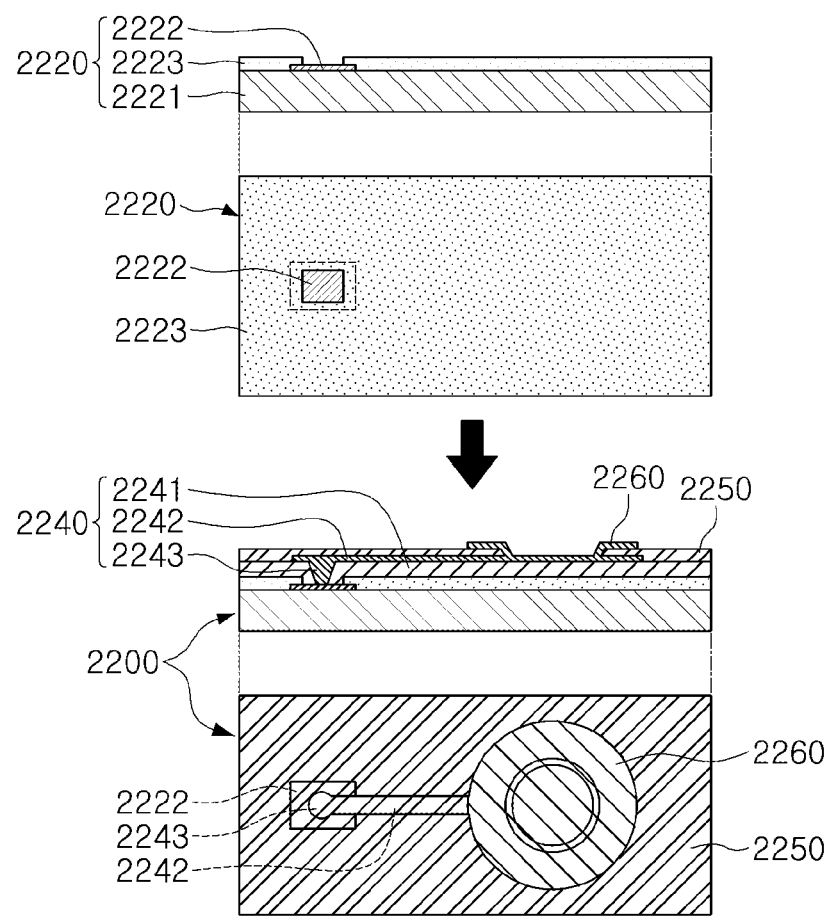
FIGS. 3A and 3B are schematic cross-sectional views illustrating states of a fan-in semiconductor package before and after being packaged.
Figure 3B:
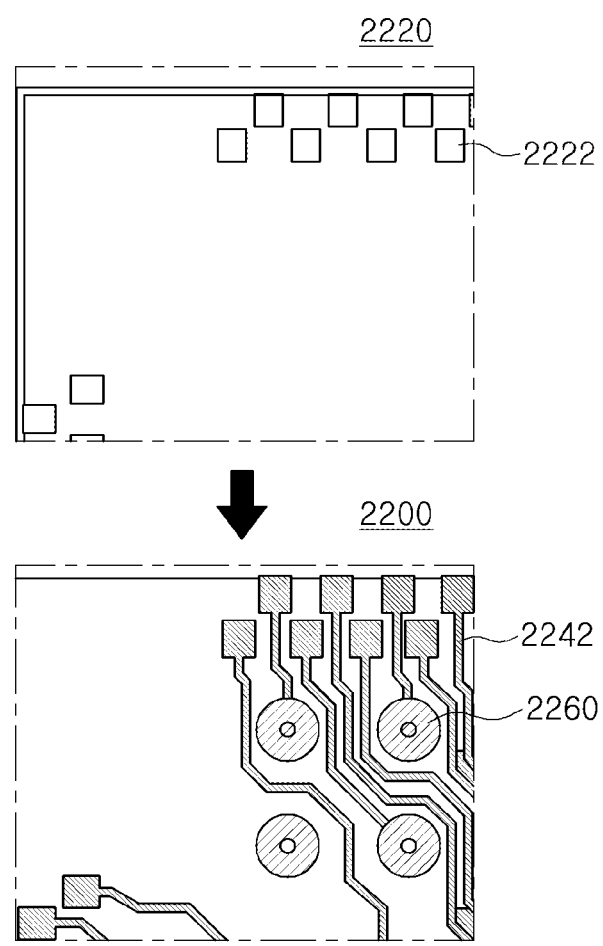

FIGS. 3A and 3B are schematic cross-sectional views illustrating states of a fan-in semiconductor package before and after being packaged.

Figure 4:
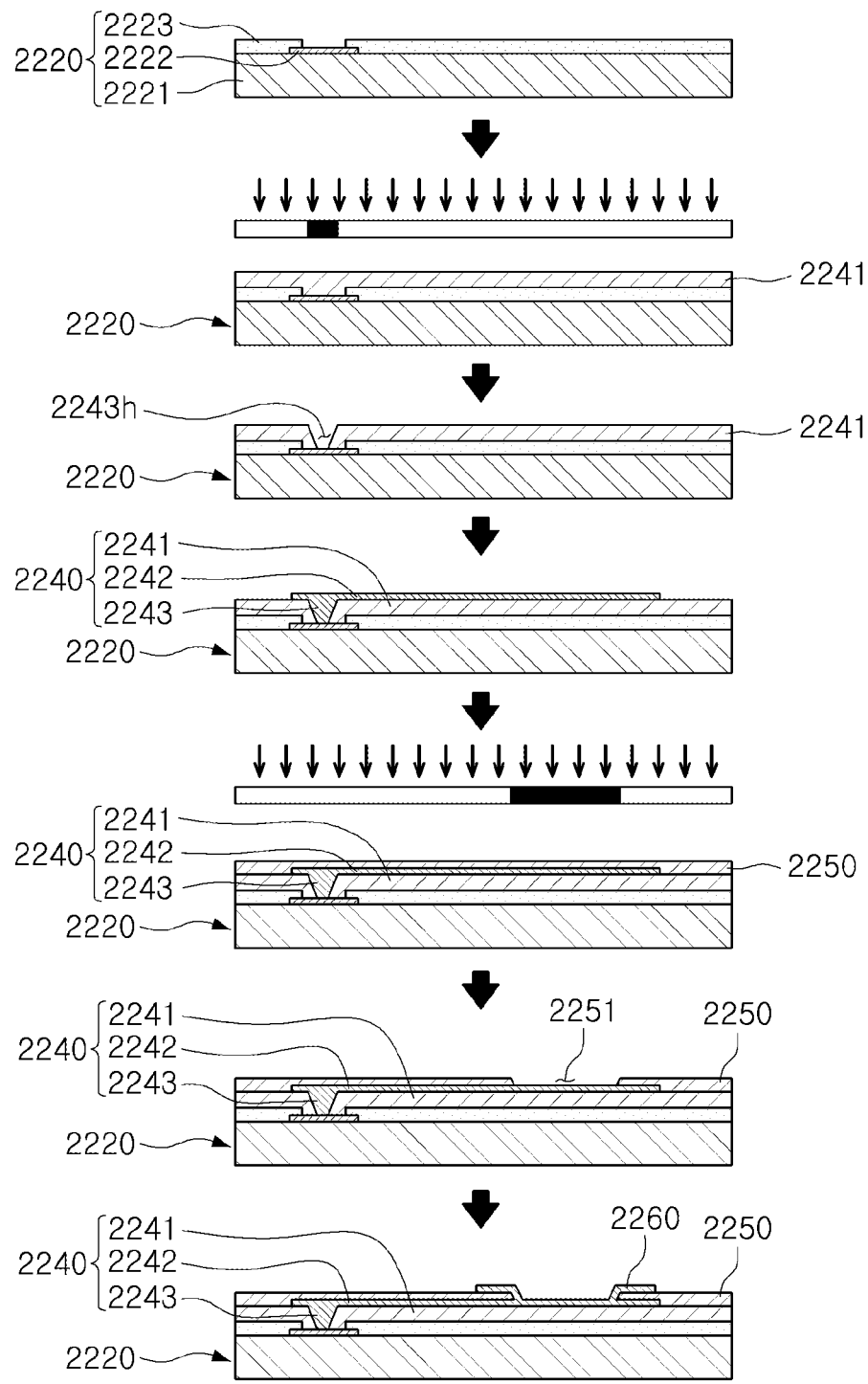
FIG. 4 is schematic cross-sectional view illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, and includes a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate size level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulation layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. For example, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
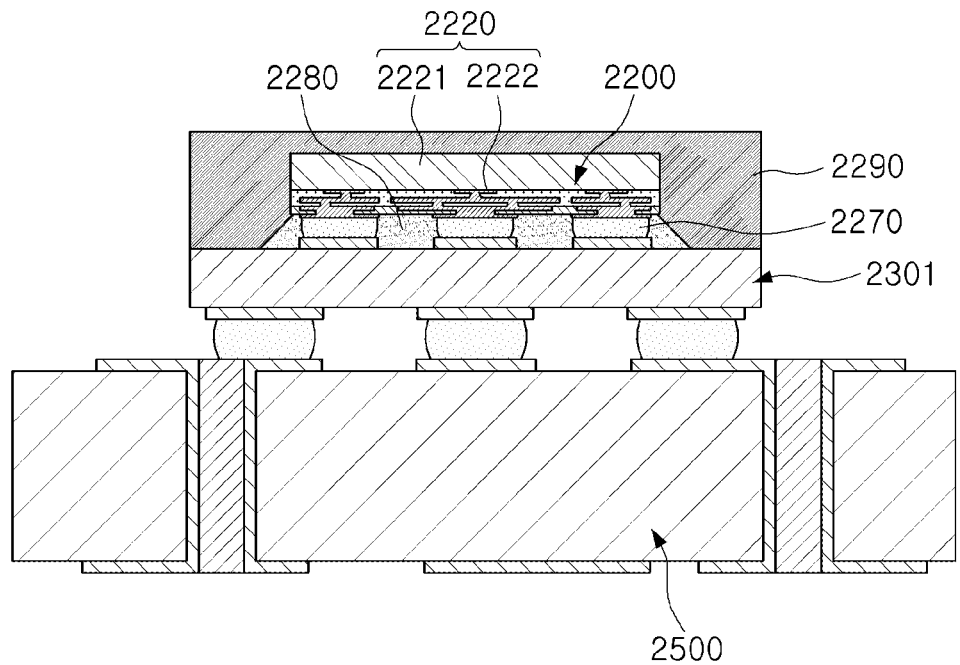
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board and is ultimately mounted on a mainboard of an electronic device.

Figure 6:
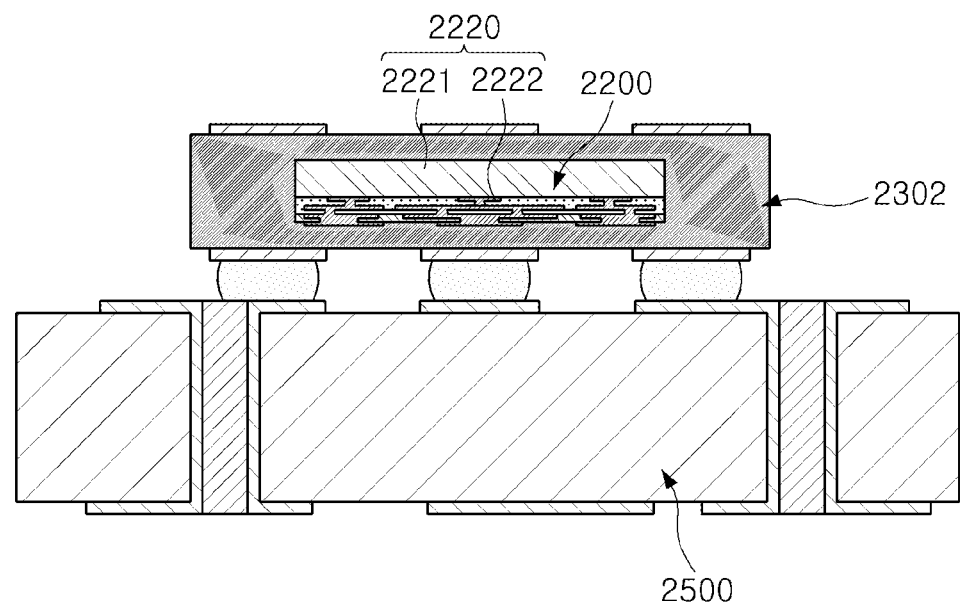
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIG. 5, a fan-in semiconductor package 2200 may be configured such that connection pads 2222 of a semiconductor chip 2220, i.e. I/O terminals are redistributed once again through a printed circuit board 2301, and the fan-in semiconductor package 2200 mounted on the printed circuit board 2301 is mounted on a main board 2500 of an electronic device. At this time, a solder ball 2270 and the like may be fixed with an underfill resin 2280, and an outer side of the semiconductor chip 2220 may be covered with a molding material 2290 or the like. Alternatively, referring to FIG. 6, the fan-in semiconductor package 2200 may be embedded in a separate printed circuit board 2302, and the connection pads 2222 of the semiconductor chip 2220, i.e., the I/O terminals may be redistributed once again in an embedded form, and ultimately mounted on the main board 2500 of the electronic device.

As above, it may be difficult to directly mount the fan-in semiconductor package on the main board of the electronic device. Therefore, it may be mounted on a separate printed circuit board, and may be then mounted on the main board of the electronic device through a packaging process, or may be mounted on the main board of the electronic device in a form embedded in the printed circuit board.

Fan-Out Semiconductor Package

Figure 7:
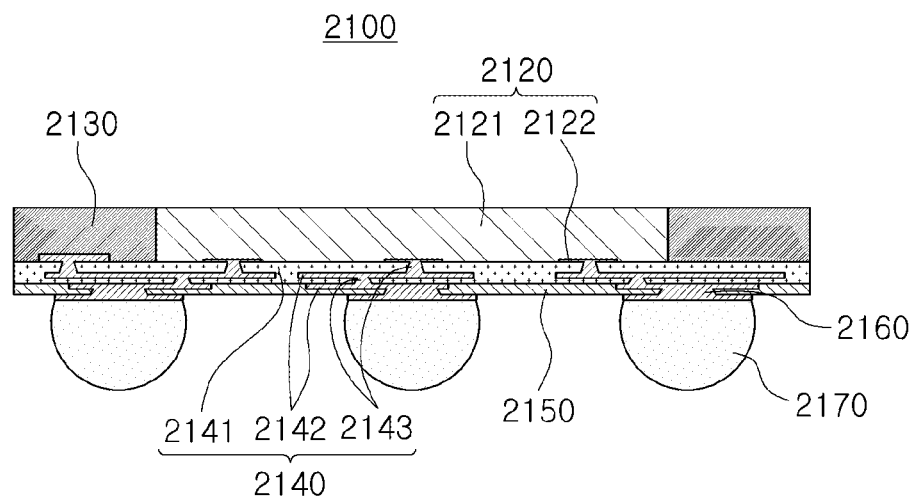
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulation layer 2141, redistribution layers 2142 formed on the insulation layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
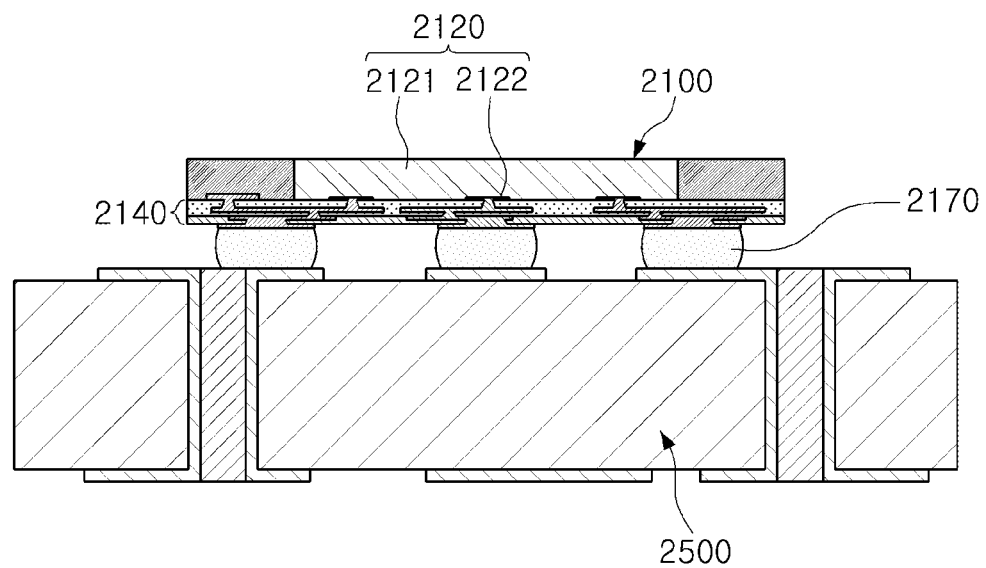
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. For example, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, a fan-out semiconductor package having a backside circuit, yet capable of shortening production time of a product, controlling plating quality of the same, eliminating a limitation to pretreatment of the same, and thinning a thickness of the same, may be described with reference to the drawings.

Figure 9:
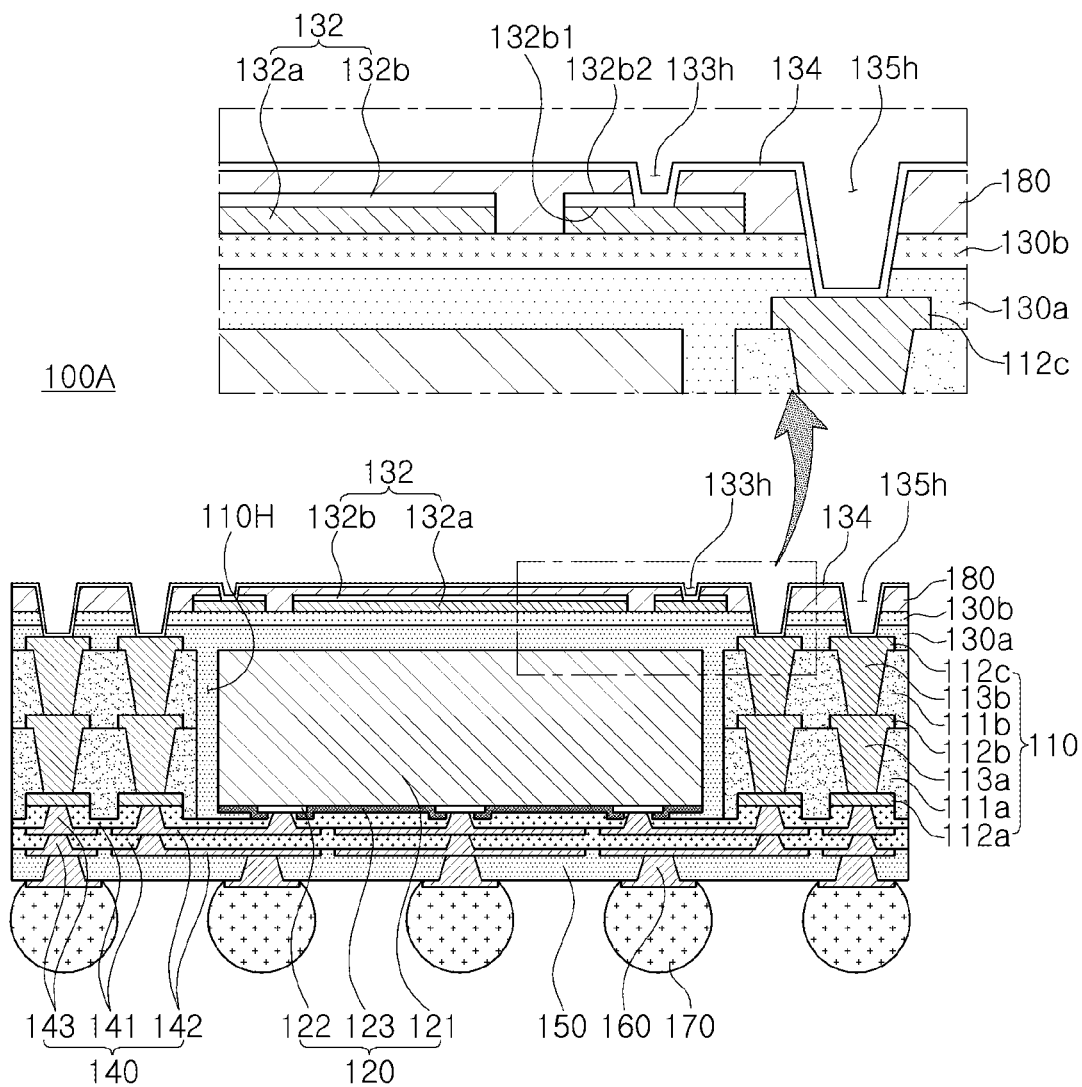
FIG. 9 is a schematic cross-sectional view illustrating an example of a fan-out semiconductor package.

FIG. 9 is a schematic cross-sectional view illustrating an example of a fan-out semiconductor package.

Referring to the drawings, a fan-out semiconductor package 100A according to an example may include a connection structure 140 including one or more redistribution layers 142; a frame 110 disposed on the connection structure 140, including one or more wiring layers 112a, 112b, and 112c and having a through-hole portion 110H; a semiconductor chip 120 disposed in the through-hole portion 110H on the connection structure 140 and having a connection pad 122 electrically connected to the one or more redistribution layers 142; an encapsulant 130a and 130b disposed on the connection structure 140 and covering at least a portion of each of the frame 110 and the semiconductor chip 120; a first metal pattern layer 132 disposed on the encapsulant 130a and 130b; an insulating material 180 disposed on the encapsulant 130a and 130b and covering the first metal pattern layer 132; a first opening 133h passing through the insulating material 180 and exposing a portion of the first metal pattern layer 132; a second opening 135h passing through the encapsulant 130a and 130b and the insulating material 180 and exposing a portion of an uppermost wiring layer 112c among the one or more wiring layers 112a, 112b, and 112c; and a second metal pattern layer 134 disposed on the insulating material 180, and extending to the first and second openings 133h and 135h and connected to the exposed first metal pattern layer 132 and the exposed uppermost wiring layer 112c, respectively.

As described above, since a fan-out semiconductor package 100A according to an embodiment basically includes the first and second metal pattern layers 132 and 134 arranged on different levels as a backside circuit, excellent signal and power characteristics may be ensured through proper placement and the like of a signal pattern and a ground pattern. For example, the first metal pattern layer 132 formed on the upper surfaces of the encapsulants 130a and 130b is not directly connected to the uppermost wiring layer 112c of the frame 110, but may be electrically connected thereto only through the path via the second metal pattern layer 134. In this case, there is no separate metal via connecting the first metal pattern layer 132 and the uppermost wiring layer 112c of the frame 110, such that the via process may be omitted once. Since a via plating process is unnecessary, a plated thickness of the first metal pattern layer 132 may be reduced, and as a result, the overall thickness of the fan-out semiconductor package 100A may also be lowered. In addition, impedance of the product may be adjusted, lead time therefor may be reduced, compared to the conventional backside circuit having two or more layers, and the cost thereof may also be reduced.

The first metal pattern layer 132 may be formed using a metal film of a carrier, which may be detached, as will be seen from a later-described process. Specifically, the first metal pattern layer 132 may be formed by forming a first metal film before being patterned by a plating process on a metal film of a carrier, and this may be introduced in a reverse form to the upper side of the package, then, the carrier may be removed from the first metal film before being patterned, and a patterning operation may be performed with a tenting process or the like, to form the first metal pattern layer 132. As a result, the first metal pattern layer 132 may be formed such that a plated layer (the first plated layer before being patterned) on the metal film of the carrier may be used as the first conductor layer 132$a$, and a second metal film may be disposed on the first conductor layer 132$a$ as the second conductor layer 132$b$, to have a reverse form in which order of a seed layer and a plated layer are changed. In this case, since the first conductor layer 132$a$ may be formed by a plating process on a matte surface 132$b$1, instead of a shiny surface 132$b$2, of the second conductor layer 132$b$, here, the second conductor layer 132$b$ may also be a metal film on the carrier, the pretreatment process may be performed in the carrier step or be simplified, to shorten the production time of the product. In addition, as the seed layer, the shiny surface 132$b$2 of the second conductor layer 132$b$, which may be a metal film having a relatively large limitation to the pretreatment process due to a thickness limit, may be raised in an upward direction, thereby eliminating the limitation to the pretreatment process. In addition, the shiny surface 132$b$2 may be coated with a rust-resistant component to facilitate peeling from the carrier, which may be easily removed by orienting the shiny surface 132$b$2 in an upward direction. In addition, a thickness of the second conductor layer 132$b$, which may be a metal film difficult to assure a maintenance of quality in the carrier step, may be adjusted. Therefore, the overall interface reliability risk and plating quality may be controlled through such thickness adjustment. In addition, since the first metal pattern layer 132 may be patterned with the tenting process, it is not necessary to require an additional copper plating process and the like. Therefore, since application of new ABF and the like, a desmearing process, and a copper chemical process are unnecessary, the production time may be further shortened. Further, since the shiny surface 132$b$2 faces in an upward direction, the quality risk of the first opening 133$h$, and the like, may be continuously removed introduced through pretreatment or desmearing process, and chemical treatment for formation of the second metal pattern layer 134, and the like.

The encapsulants 130$a$ and 130$b$ may include a first encapsulant 130$a$ disposed on the connection structure 140 and covering at least a portion of each of the frame 110 and the semiconductor chip 120, and a second encapsulant 130$b$ covering the first encapsulant 130$a$. The first encapsulant 130$a$ and the second encapsulant 130$b$ may be distinct layers and may be distinguished by a boundary, but in some cases the boundary may be indefinite. The first metal pattern layer 132 and the insulating material 180 may be disposed on the second encapsulant 130$b$. In this case, a better adhesion may be obtained. For example, as described above, when the first conductor layer 132$a$ is formed on the second conductor layer 132$b$, which may be a metal film on the carrier, by a plating process to form the first metal pattern layer 132 before being patterned, the first metal pattern layer 132 before being patterned may be covered with the second encapsulant 130$b$. Then, when the first metal pattern layer 132 before being patterned covered with the second encapsulant 130$b$ is laminated in a reverse form and introduced to the first encapsulant 130$a$, a better adhesion may be secured.

An fan-out semiconductor package 100A according to an example may further include a passivation layer 150 disposed below the connection structure 140, and having a plurality of openings for respectively exposing at least a portion of a lowermost redistribution layer 142 among the redistribution layers 142; a plurality of under-bump metals 160 respectively disposed on the plurality of openings and electrically connected to the lowermost redistribution layer 142, respectively; and a plurality of electrical connection metals 170 disposed below the passivation layer 150 and electrically connected to the plurality of under-bump metals 160, respectively.

Hereinafter, each configuration included in a fan-out semiconductor package 100A according to an example will be described in more detail with reference to the drawings.

The frame 110 may further improve the rigidity of the fan-out semiconductor package 100A according to a specific material of the insulation layers 111$a$ and 111$b$, and may play a role of ensuring thickness uniformity of the encapsulants 130$a$ and 130$b$. The frame 110 may have the through-hole portion 110H passing through the insulation layers 111$a$ and 111$b$. The semiconductor chip 120 may be disposed in the through-hole portion 110H, and passive components (not illustrated) may be disposed together as necessary. The through-hole portions 110H may be in the form of a wall surface surrounding the semiconductor chip 120, but not limited thereto. The frame 110 may include the wiring layers 112$a$, 112$b$, and 112$c$ and the wiring vias 113$a$ and 113$b$, in addition to the insulation layers 111$a$ and 111$b$, and thus may function as an electrical connection member for providing a vertical electrical connection path. As necessary, an electrical connection member capable of providing another type of a vertical electrical connection path such as a metal post, instead of the frame 110, may be introduced.

The frame 110 may include a first insulation layer 111$a$ in contact with the connection structure 140; a first wiring layer 112$a$ in contact with the connection structure 140 and embedded in the first insulation layer 111$a$; a second wiring layer 112$b$ disposed on a side of the first insulation layer 111$a$, opposite to a side in which the first wiring layer 112$a$ is embedded; a second insulation layer 111$b$ disposed on the first insulation layer 111$a$ and covering the second wiring layer 112$b$; and a third wiring layer 112$c$ disposed on a side of the second insulation layer 111$b$, opposite to a side in which the second wiring layer 112$b$ is embedded. The first and second wiring layers 112$a$ and 112$b$ and the second and third wiring layers 112$b$ and 112$c$ may be electrically connected to each other through first and second wiring vias 113$a$ and 113$b$ passing through the first and second insulation layers 111$a$ and 111$b$, respectively. The first to third wiring layers 112$a$, 112$b$, and 112$c$ may be electrically connected to the connection pad 122 through the redistribution layer 142 and the connection via 143, in accordance with functions thereof.

Materials of the insulation layers 111$a$ and 111$b$ are not particularly limited. For example, an insulating material may be used. As the insulating material, a thermosetting resin such as an epoxy resin, a thermoplastic resin such as polyimide, or a resin in which a thermosetting resin or a thermoplastic resin is mixed with an inorganic filler, for example, ABF (Ajinomoto Build-up Film), or the like, may be used. Alternatively, a material in which a core material such as glass fiber, glass cloth, glass fabric, or the like, together with an inorganic filler are impregnated in the above-mentioned resin, for example, a prepreg, or the like may be used as insulation material=.

The wiring layers 112$a$, 112$b$, and 112$c$ together with the wiring vias 113$a$ and 113$b$ may provide a vertical electrical connection path for the package, and may perform the role of redistributing the connection pad 122. As a material for forming the wiring layers 112$a$, 112$b$, and 112$c$, a metal material such as copper (Cu), aluminum (Al), silver (Ag), tin (Sn), gold (Au), nickel (Ni), lead (Pb), titanium (Ti), or alloys thereof may be used. The wiring layers 112a, 112b, and 112c may perform various functions, depending on a desired design of the layer. For example, a ground (GND) pattern, a power (PWR) pattern, a signal (S) pattern, and the like, may be included. Here, the signal (S) pattern may include various signal patterns except for a ground (GND) pattern, a power (PWR) pattern, and the like, for example, a data signal pattern and the like. The ground (GND) pattern and the power (PWR) pattern may be the same pattern. The wiring layers 112a, 112b, and 112c may include various types of via pads and the like. The wiring layers 112a, 112b, and 112c may be formed by a known plating process, and may be composed of a seed layer and a conductor layer, respectively.

A thickness of each of the wiring layers 112a, 112b, and 112c may be thicker than a thickness of each of the redistribution layers 142. For example, the frame 110 may have a thickness equal to or greater than a thickness of the semiconductor chip 120. In order to maintain rigidity, prepregs and the like may be selected as the material of the insulation layers 111a and 111b, and wiring layers 112a, 112b, and 112c may be relatively thick. The connection structure 140 may require a fine circuit and a high-density design. Therefore, a photo-imageable dielectric (PID)resin, or the like, may be selected as the material of the insulation layer 141, and a thickness of the redistribution layer 142 obtained therefrom may be relatively thin.

The first wiring layer 112a may be recessed into the first insulation layer 111a. In this way, in a case which the first wiring layer 112a is recessed into the first insulation layer 111a to have a step difference between a surface of the first insulation layer 111a in contact with the connection structure 140 and a surface of the first wiring layer 112a in contact with the connection structure 140, when the semiconductor chip 120 and the frame 110 are encapsulated with the encapsulant 130a, the forming material may be prevented from being bleeding to contaminate the first wiring layer 112a.

The wiring vias 113a and 113b may electrically connect the wiring layers 112a, 112b, and 112c formed on different layers, thereby forming an electrical path in the frame 110. As the material for forming the wiring vias 113a and 113b, a metal material, such as copper (Cu), aluminum (Al), silver (Ag), tin (Sn), gold (Au), nickel (Ni), lead (Pb), titanium (Ti), or alloys thereof may be used. The wiring vias 113a and 113b may include a signal via, a power via, a ground via, etc. The power via and ground via may be the same via. The wiring vias 113a and 113b may also be a filled type via filled with a metal material, respectively, or may be a conformal type via in which a metal material is formed along a wall surface of a via hole. Further, they may each have a tapered shape. The wiring vias 113a and 113b may be also be formed by a plating process, and may be respectively composed of a seed layer and a conductor layer.

A portion of the pads of the first wiring layer 112a may serve as a stopper, when a hole for the first wiring via 113a is formed. The first wiring via 113a may advantageously have a tapered shape in which the width of the upper surface thereof is wider than the width of the lower surface thereof in terms of the process. In this case, the first wiring via 113a may be integrated with the pad pattern of the second wiring layer 112b. When a hole for the second wiring via 113b is formed, a portion of the pads of the second wiring layer 112b may serve as stoppers. The second wiring via 113b may have a tapered shape in which the width of the upper surface thereof is wider than the width of the lower surface thereof in terms of the process. In this case, the second wiring via 113b may be integrated with the pad pattern of the third wiring layer 112c.

Although not illustrated in the drawing, a metal layer (not illustrated) may be disposed on a wall surface of the through-hole portion 110H of the frame 110 for the purpose of shielding electromagnetic waves or for dissipating heat as required, the metal layer (not illustrated) may surround the semiconductor chip 120.

The semiconductor chip 120 may be an integrated circuit (IC) in which hundreds to millions of devices are integrated into one chip. In this case, the integrated circuit may be an application processor chip, such as a central processor (e.g., CPU), a graphics processor (e.g., GPU), a digital signal processor, a cryptographic processor, a microprocessor, and the like, but is not limited thereto; may be a power management IC (PMIC), or may be a memory chip such as a volatile memory (for example, a dynamic random access memory (DRAM)), anon-volatile memory (for example, a read only memory (ROM)), a flash memory, or the like, or may be a logic chip such as an analog-to-digital converter, an application-specific IC (ASIC), or the like.

The semiconductor chip 120 may be an integrated circuit in a bare state in which no separate bump or wiring layer is formed, but is not limited thereto, and may be a packaged type integrated circuit, as needed. The integrated circuit may be formed based on an active wafer. In this case, silicon (Si), germanium (Ge), gallium arsenide (GaAs), or the like may be used as a base material of a body 121 of the semiconductor chip 120. Various circuits may be formed in the body 121. The connection pad 122 may be used to electrically connect the semiconductor chip 120 to other components, and a conductive material such as aluminum (Al), and the like, may be used as a formation material thereof without any particular limitation. A passivation film 123 exposing the connection pad 122 may be formed on the body 121. The passivation film 123 may be an oxide film or a nitride film, or may be a double layer of an oxide film and a nitride film. An insulating film (not illustrated) or the like may be further disposed in other necessary positions. Meanwhile, in the semiconductor chip 120, a surface on which the connection pad 122 is disposed may become an active surface, and a surface opposite thereto may become an inactive surface. At this time, when the passivation film 123 is formed on the active surface of the semiconductor chip 120, the active surface of the semiconductor chip 120 may determine a positional relationship based on the lowermost surface of the passivation film 123.

The first encapsulant 130a may encapsulate the frame 110 and the semiconductor chip 120, and may also fill at least a portion of the through-hole portion 110H. The first encapsulant 130a may include an insulating material. Examples of the insulating material may include, for example, a thermosetting resin such as an epoxy resin, a thermoplastic resin such as polyimide, or a resin including a thermosetting resin or a thermosetting resin with a reinforcing material such as an inorganic filler, specifically ABF, FR-4, BT resin, etc. In addition, a known molding material such as EMC may be used. Further, a photosensitive material, for example, a photo imageable encapsulant (PIE) may be used as needed. A material in which an insulating resin such as a thermosetting resin or a thermoplastic resin is impregnated with a core material such as an inorganic filler and/or glass fiber, or the like, may also be used, as necessary.

Further, the second encapsulant 130b may cover the first encapsulant 130a. The second encapsulant 130b may also include an insulating material, for example, a thermosetting resin such as an epoxy resin, a thermoplastic resin such as polyimide, or a resin including a thermosetting resin or a thermosetting resin with a reinforcing material such as an inorganic filler, specifically ABF, FR-4, BT resin, etc. In addition, a known molding material such as EMC may be used. Further, a photosensitive material, for example, a photo imageable encapsulant (PIE) may be used as needed. A material in which an insulating resin such as a thermosetting resin or a thermoplastic resin impregnated with a core material such as an inorganic filler and/or glass fiber, or the like, may also be used, as necessary.

The first metal pattern layer 132 may be disposed on the second encapsulant 130b to provide a backside circuit to the fan-out semiconductor package 100A. The first metal pattern layer 132 may also include conductive materials, such as copper (Cu), aluminum (Al), silver (Ag), tin (Sn), gold (Au), nickel (Ni), lead (Pb), titanium (Ti), or alloys thereof. The first metal pattern layer 132 may perform various functions, depending on a desired design. For example, a ground (GND) pattern, a power (PWR) pattern, a signal (S) pattern, and the like, may be included. Here, the signal (S) pattern may include various signal patterns except for a ground (GND) pattern, a power (PWR) pattern, and the like, for example, a data signal pattern and the like. The ground (GND) pattern may also function as a power (PWR) pattern.

The first metal pattern layer 132 may include a first conductor layer 132a disposed on the second encapsulant 130b and a second conductor layer 132b disposed on the first conductor layer 132a. The first and second conductor layers 132a and 132b may include the above-described metal materials such as copper (Cu), titanium (Ti), and the like, respectively. The second conductor layer 132b may be introduced by a metal film to function as a seed layer, and the first conductor layer 132a may function as a plated layer formed based on such a seed layer. Therefore, a thickness of the first conductor layer 132a may be thicker than a thickness of the second conductor layer 132b. For example, the first metal pattern layer 132 may be a structure in which the first and second conductor layers 132a and 132b are arranged in a reverse form. In this respect, the second conductor layer 132b may have a matte surface 132b1 and a shiny surface 132b2, and a lower surface thereof may be the matte surface 132b1 and an upper surface thereof may be the shiny surface 132b2. For example, a surface roughness of a surface of the second conductor layer 132b contacting the first conductor layer 132a may be greater than a surface roughness of the opposite surface. In this case, as described above, the pretreatment process may be performed in the carrier step or be simplified, to shorten the production time of the product. In addition, the shiny surface 132b2 may be raised in an upward direction, thereby eliminating the limitation to the pretreatment process.

The insulating material 180 may further provide an insulation layer on the backside side of the fan-out semiconductor package 100A. The insulating material 180 also may include an insulating material. Examples of the insulating material may include, for example, a thermosetting resin such as an epoxy resin, a thermoplastic resin such as polyimide, or a resin including a thermosetting resin or a thermoplastic resin with a reinforcing material such as an inorganic filler, specifically ABF, FR-4, BT resin, etc. Further, a photosensitive material, for example, a photo-imageable dielectric (PID) material may be used as needed. A material in which an insulating resin such as a thermosetting resin or a thermoplastic resin impregnated with a core material such as an inorganic filler and/or glass fiber, or the like, may be used, as needed.

The second metal pattern layer 134 may be disposed on the insulating material 180 to provide a backside circuit for the fan-out semiconductor package 100A as well. The second metal pattern layer 134 may have an electromagnetic wave shielding effect and a heat dissipation effect. The second metal pattern layer 134 may also include the above-described metal materials such as copper (Cu) and titanium (Ti). The second metal pattern layer 134 may perform various functions, depending on a desired design. For example, a ground (GND) pattern, a power (PWR) pattern, a signal (S) pattern, and the like, may be included. Here, the signal (S) pattern may include various signal patterns except for a ground (GND) pattern, a power (PWR) pattern, and the like, for example, a data signal pattern and the like. The ground (GND) pattern may also function as a power (PWR) pattern.

The second metal pattern layer 134 may be disposed on the insulating material 180, and may extend into the first and second openings 133h and 135h, and, thus, may be connected to the exposed metal pattern layer 132 and the exposed uppermost wiring layer 112c, by the first and second openings 133h and 135h, respectively. In one example, the first opening 133h may also pass through the second conductor layer 132b, such that the first conductor layer 132a may be exposed by the first opening 133h. Therefore, the second metal pattern layer 134 may be in contact with an exposed surface of the first conductor layer 132a and a side surface of the second conductor layer 132b in the first opening 133h. The second metal pattern layer 134 may be arranged in the form of a conformal via to have a constant thickness along the wall surface of each of the first and second openings 133h and 135h. Here, the constant thickness refers to substantially the same thickness. In this case, the second metal pattern layer 134 may be easily formed on the insulating material 180, to connect to the first metal pattern layer 132 and the uppermost wiring layer 112c, without problems of voids or lifting. The second opening 135h may pass through the encapsulants 130a and 130b and the insulating material 180, while the first opening 133h may pass through only the insulating material 180. Therefore, a height of the second opening 135h may be greater than a height of the first opening 133h. Further, a distance of a major axis of a cut surface of the second opening 135h is longer than a distance of a major axis of a cut surface of the first opening 133h on any level, when the first and second openings 133h and 135h are cut in the same plane.

The connection structure 140 may redistribute the connection pad 122 of the semiconductor chip 120. The connection pads 122 of several tens to hundreds of semiconductor chips 120 having various functions may be redistributed through the connection structure 140. The connection pads 122 may be physically and/or may be electrically connected externally, in accordance with functions thereof, through the electrical connection metal 170. The connection structure 140 may include an insulation layer 141, a redistribution layer 142 disposed on the insulation layer 141, and a connection via 143 passing through the insulation layer 141, and electrically connecting the connecting pad 122 and the redistribution layer 142, and the lowermost wiring layer 112a among the wiring layers 112a, 112b, and 112c and the redistribution layer 142. The number of insulation layer 141, the redistribution layer 142 and the connection via 143 may be more or less than those illustrated in the drawings.

As the material of the insulation layer 141, an insulating material may be used. In this case, a photo-imageable dielectric (PID) material may be used as an insulating material. In this case, a fine pitch may be introduced through the photo-via process. Tens to millions of the connection pads 122 in the semiconductor chip 120 may be redistributed very effectively as in the conventional case. The insulation layer 141 may be bounded to each other, and the boundaries may be unclear.

The redistribution layer 142 may be redistribute the connection pad 122 of the semiconductor chip 120 to electrically connect the connection pad 122 of the semiconductor chip 120 to the electrical connection metal 170. As a material for forming the redistribution layer 142, a metal material such as copper (Cu), aluminum (Al), silver (Ag), tin (Sn), gold (Au), nickel (Ni), lead (Pb), titanium (Ti), or alloys thereof may be used. The redistribution layer 142 may also perform various functions, depending on a desired design. For example, aground (GND) pattern, a power (PWR) pattern, a signal (S) pattern, and the like, may be included. The ground (GND) pattern and the power (PWR) pattern may be the same pattern. In addition, the redistribution layer 142 may include various types of via pads, electrical connection metal pads, and the like. The redistribution layer 142 may be formed by a plating process, and may include a seed layer and a conductor layer.

The connection via 143 may electrically connect the redistribution layer 142 formed on different layers, and may electrically connect the connection pad 122 of the semiconductor chip 120 and the lowermost wiring layer 112a of the frame 110 to the redistribution layer 142. The connection via 143 may be in physical contact with the connection pad 122, when the semiconductor chip 120 is a bare die. As the material for forming the connection via 143, a metal material, such as copper (Cu), aluminum (Al), silver (Ag), tin (Sn), gold (Au), nickel (Ni), lead (Pb), titanium (Ti), or alloys thereof may be used. The connection via 143 may include a signal via, a power via, a ground via, etc. The power via and ground via may be the same via. The connection via 143 may also be a filled type via filled with a metal material, or may be a conformal type via in which a metal material is formed along a wall surface of a via hole. Further, each of the wiring vias 113a and 113b may have a shape tapered in an opposite direction. The connection via 143 may also be formed using a plating process, and may be composed of a seed layer and a conductor layer.

The passivation layer 150 may be an additional structure for protecting the connection structure 140 from external physical or chemical damage, or the like. The passivation layer 150 may include a thermosetting resin. For example, the passivation layer 150 may be ABF, but is not limited thereto. The passivation layer 150 may have openings for exposing at least a portion of the lowermost redistribution layer 142 among the redistribution layers 142. The number of openings may be in the range of tens to tens of thousands, or more or less. Each of the openings may be formed of a plurality of holes. As necessary, a surface mounting component such as a capacitor may be disposed on the lower surface of the passivation layer 150 to be electrically connected to the redistribution layer 142, and as a result, may be electrically connected to the semiconductor chip 120.

The under-bump metal 160 may also be an additional component, which improves the connection reliability of the electrical connection metal 170, and thus improves the board level reliability of a fan-out semiconductor package 100A according to an example. The under-bump metal 160 may be provided as the number of tens to tens of thousands, and may be provided as the number more or less than that numbers. Each under-bump metal 160 may be electrically connected to the exposed lowermost redistribution layer 142 formed at the opening of the passivation layer 150. The under-bump metal 160 may be formed by a known metallization method using a known conductive material, for example, metal, but is not limited thereto.

The electrical connection metal 170 may also be an additional component, a configuration for physically and/or electrically connecting a fan-out semiconductor package 100A externally. For example, the fan-out semiconductor package 100A may be mounted on the main board of the electronic device through the electrical connection metal 170. The electrical connection metal 170 may be disposed on the passivation layer 150, and may be electrically connected to the under-bump metal 160, respectively. The electrical connection metal 170 may be composed of a low melting point metal, for example, tin (Sn), or an alloy including tin (Sn). More specifically, it may be formed of a solder or the like, but this may be merely an example embodiment, and the material is not particularly limited thereto.

The electrical connection metal 170 may be a land, a solder ball, a pin, or the like. The electrical connection metal 170 may be formed of multiple layers or a single layer. In a case of being formed of multiple layers, it may include a copper pillar and a solder. In a case of being formed of a single layer, tin-silver solder or copper may be included, but this may be merely an example and is not limited thereto. The number, interval, arrangement type, etc., of the electrical connection metal 170 are not particularly limited, and may be sufficiently modified, depending on a design specification by a skilled artisan. For example, the number of electrical connection metal 170 may be in the range of tens to thousands, depending on the number of connection pads 122, and may be more or less than the above range.

At least one of the electrical connection metal 170 may be disposed in a fan-out area. The fan-out area may be an area, except for those in which the semiconductor chip 120 is disposed. The fan-out package may be more reliable than the fan-in package, may have many I/O terminals, and may facilitate 3D interconnection. In addition, a package thinner than a ball grid array (BGA) package, a land grid array (LGA) package, and the like, may be manufactured, and may be excellent in price competitiveness.

FIGS. 10 to 14 are schematic views illustrating an example manufacturing procedure of the fan-out semiconductor package of FIG. 9.

Figure 10:
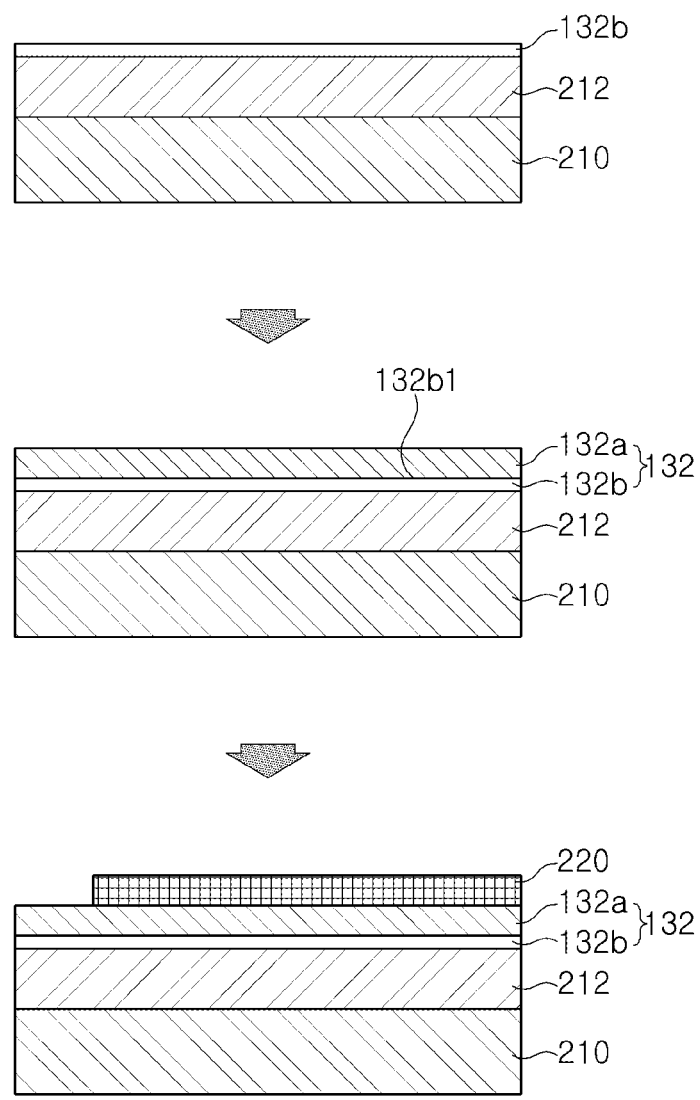
FIGS. 10 to 14 are schematic views illustrating an example manufacturing procedure of the fan-out semiconductor package of FIG. 9.
Figure 11:
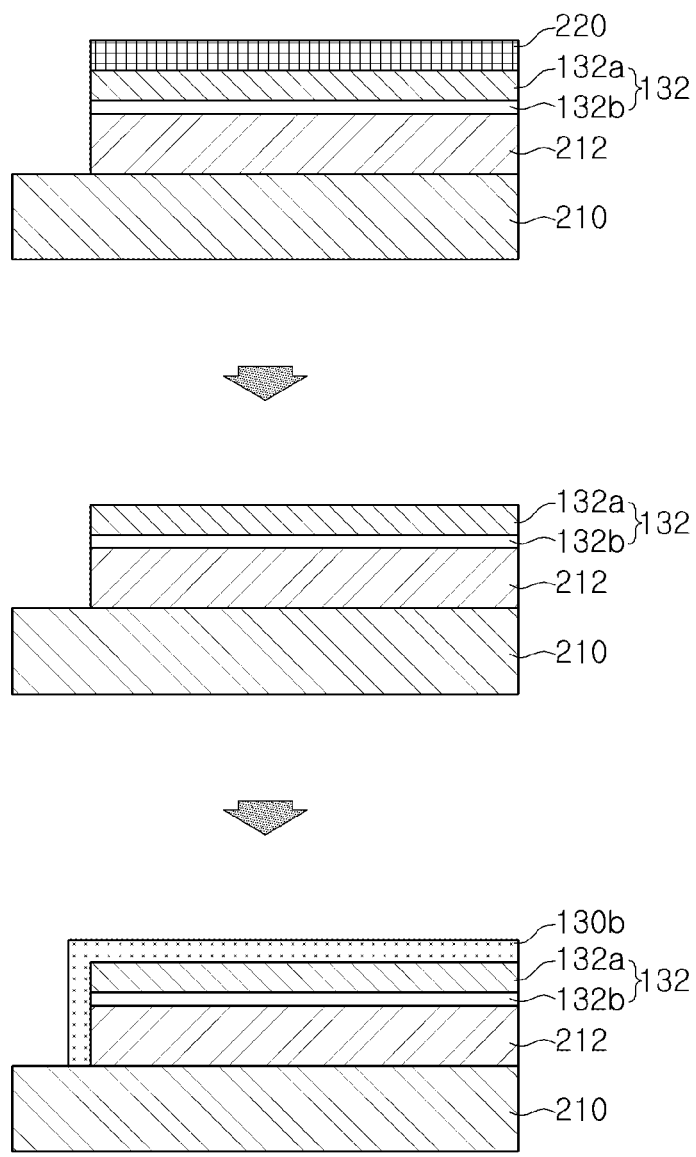

FIGS. 10 and 11 schematically illustrate an example of a process of forming a first metal pattern layer 132 before being patterned, and a second encapsulant 130b covering the first metal pattern layer 132, using a first carrier 210.

Referring to FIG. 10, first, a first carrier 210, in which a metal layer 212 and a metal film 132b are arranged in sequence on at least one surface thereof, may be prepared. As the first carrier 210, a known copper clad laminate (CCL) or the like may be used. The metal film 132b may be used as a second conductor layer 132b of the first metal pattern layer 132, as will be described later. Next, a matte surface 132b1 of the metal film 132b may be pretreated with cubic zirconia (CZ) or the like to adjust the metal film 132b to a desired thickness. Further, the metal film 132b may be used as a seed layer to form a plated layer 132a on the matte surface 132b1 of the metal film 132b. The plated layer 132a may be used as a first conductor layer 132a of the first metal pattern layer 132, as will be described later. Next, a dry film 220 may be coated on the plated layer 132*a*, may be exposed to light, and may be developed to expose an edge portion of the plated layer 132*a*.

Referring to FIG. 11, next, edge portions of the plated layer 132*a*, the metal film 132*b*, and the metal layer 212 may be removed by an etching process. Next, the dry film 220 may be removed, and a surface of the plated layer 132*a* may be treated with cubic zirconia (CZ) or the like. Next, a second encapsulant 130*b* covering the plated layer 132*a*, the metal film 132*b*, and the metal layer 212 may be formed on the first carrier 210 by stacking and curing ABF or the like. The first metal pattern layer 132 before being patterned and the second encapsulant 130*b* covering the first metal pattern layer 132 may be formed on the first carrier 210 through a separate process.

Figure 12:
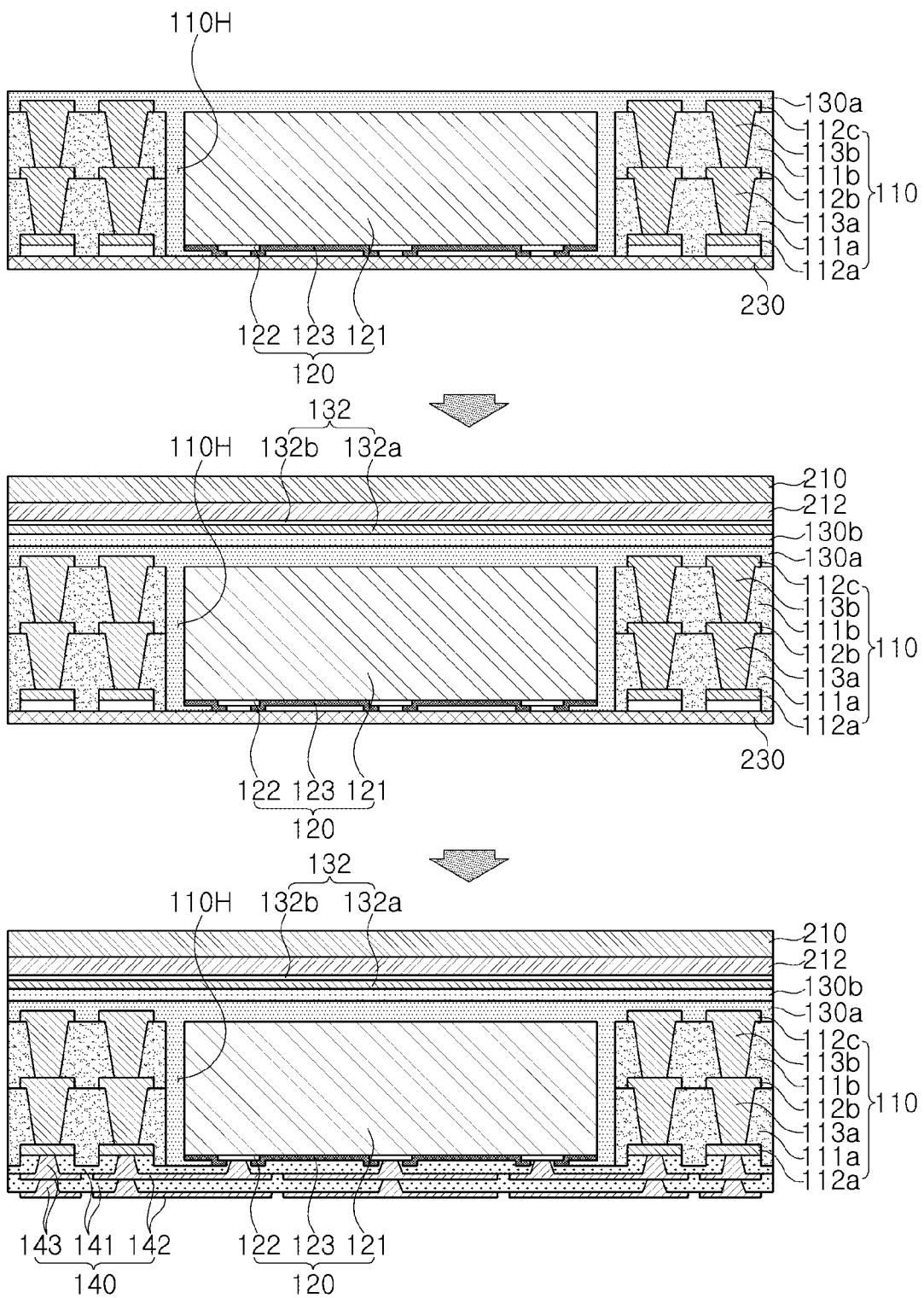
Figure 13:
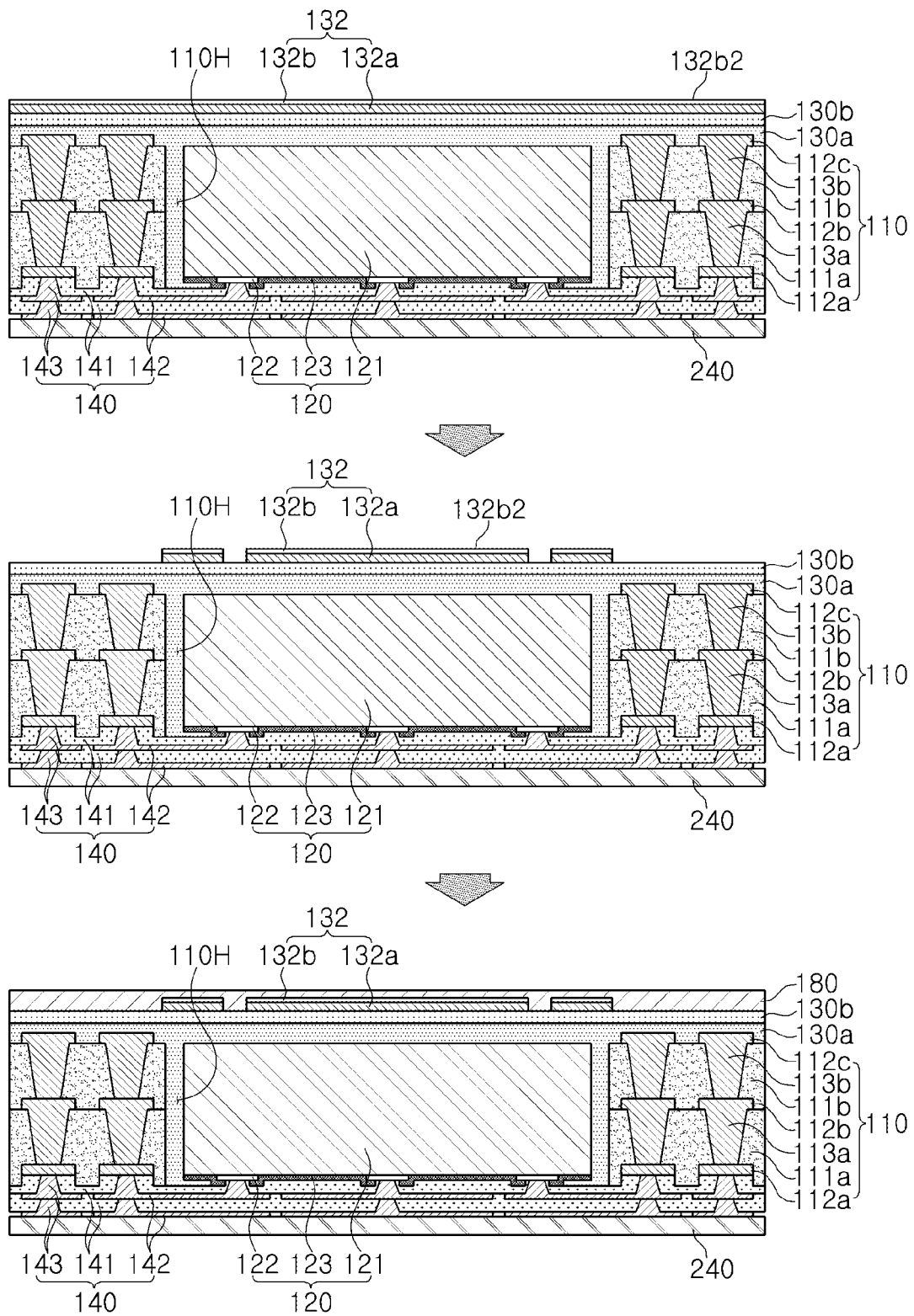
Figure 14:
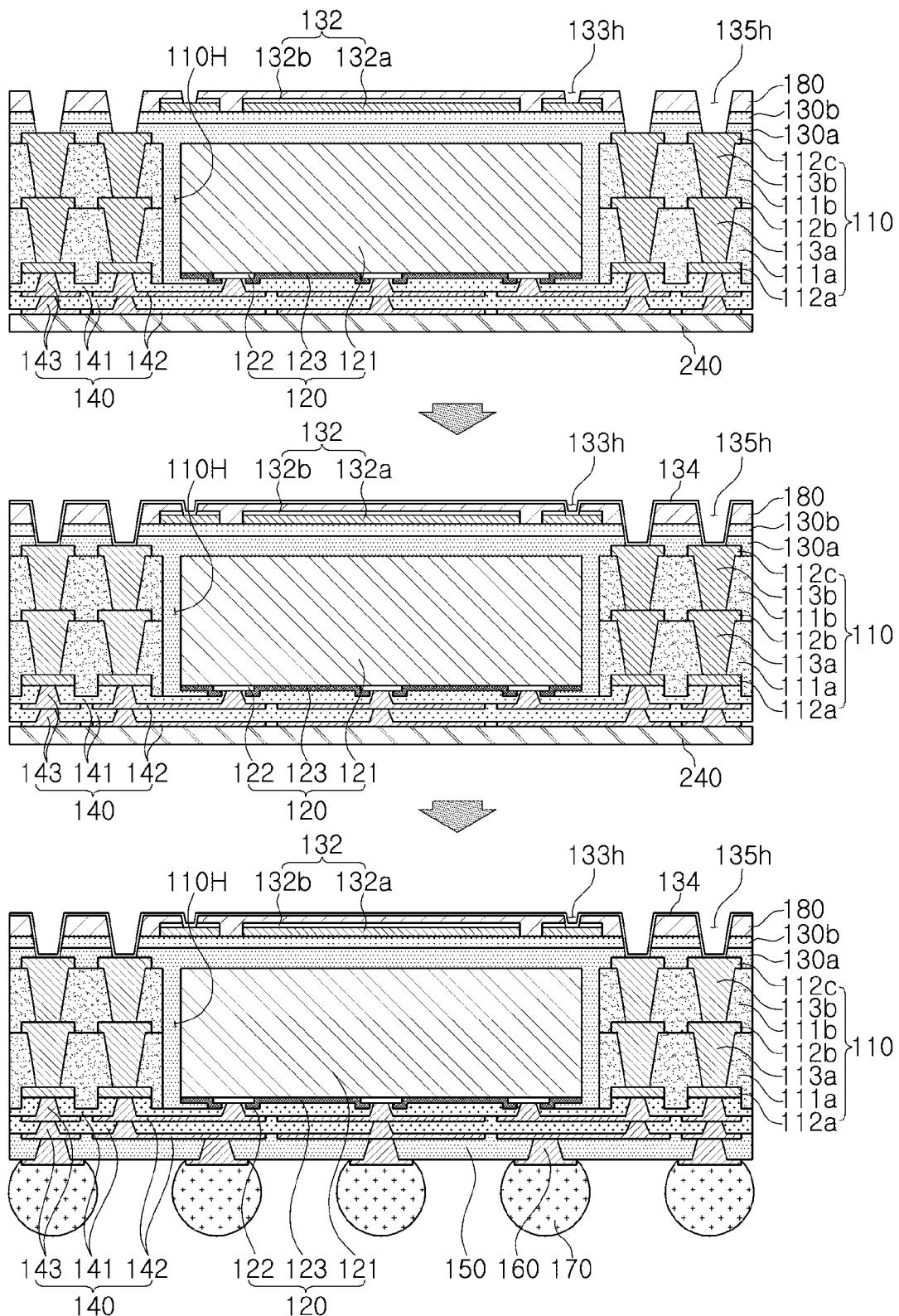

Next, FIGS. 12 to 14 schematically illustrate an example of a process of introducing a backside circuit using the first metal pattern layer 132 before being patterned and the second encapsulant 130*b* covering the first metal pattern layer 132, formed on the first carrier 210.

Referring to FIG. 12, a frame 110 manufactured in advance may be attached to a tape 230 or the like, a semiconductor chip 120 may be attached on the tape 230 exposed through a through-hole portion 110H of the frame 110 in a face-down manner, and they may be encapsulated with a first encapsulant 130*a*. Next, a first carrier 210 may be attached on the first encapsulant 130*a* such that a first metal pattern layer 132 before being patterned and a second encapsulant 130*b* covering the first metal pattern layer 132, which may be formed by a separate process as described above, may be laminated in a reverse form on the first encapsulant 130*a*. The first carrier 210 may perform a warpage control function during a process. Next, the tape 230 may be removed, and a connecting structure 140 may be formed in a region from which the tape 230 is removed. The connection structure 140 may be formed by repeatedly forming an insulation layer 141 using a PID or the like, forming a via hole by a photolithography process, and then forming a redistribution layer 142 and a connection via 143 by a plating process. As a plating process used, an additive process (AP), a semi-AP (SAP), a modified SAP (MSAP), a tenting process, and the like, may be used.

Referring to FIG. 13, the first carrier 210 and the metal layer 212 may be separated from the metal film 132*b*, and a second carrier 240 may be attached onto the connection structure 140. In this case, a shiny surface 132*b*2 of a metal film 132*b* may be coated with a rust-resistant component to assist a peel-off function. In an example, since the shiny surface 132*b*2 faces in an upward direction, such a rust-resistant component may be removed in the pretreatment process or the like. The second carrier 240 may also perform a warpage control function during a process. Next, the first metal pattern layer 132 before being patterned may be patterned by a tenting process to form the first metal pattern layer 132. For example, when patterning directly by the tenting process, a separate copper plating operation or the like may be unnecessary. Therefore, since application of new ABF and the like, a desmearing process, and a copper chemical process are unnecessary, the production time may be further shortened. The metal film 132*b* may become a second conductor layer 132*b* by the patterning, and the plated layer 132*a* may become a first conductor layer 132*a*. Thereafter, the shiny surface 132*b*2 of the second conductor layer 132*b* of the first metal pattern layer 132 exposed in an upward direction may be pretreated with cubic zirconia (CZ) or the like. Next, ABF or the like may be stacked and cured on the second encapsulant 130*b* to cover the first metal pattern layer 132, to form an insulating material 180.

Referring to FIG. 14, next, a first opening 133*h* and a second opening 135*h* may be formed by a process such as using a laser drill or the like. After the first and second openings 133*h* and 135*h* are formed, a desmearing process or the like may be performed. Next, a second metal pattern layer 134 may be formed on the insulating material 180 and on the first and second openings 133*h* and 135*h* using an electrolytic plating process or the like. Next, when the second carrier 240 is removed, and a passivation layer 150, an under bump metal 160, an electrical connection metal 170, and the like may be formed in a region from which the second carrier 240 is removed as needed, the fan-out semiconductor package 100A according to the above-described example may be manufactured. A series of processes may be performed at a relatively large panel level. In this case, a plurality of fan-out semiconductor packages 100A may be formed through the same process, and then a plurality of fan-out semiconductor packages 100A may be separately formed through a singulation process. Therefore, the productivity may be further improved.

Figure 15A:
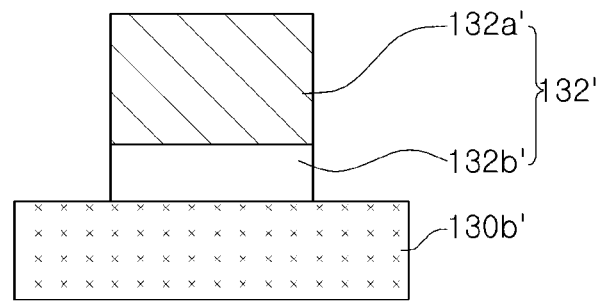
FIGS. 15A to 15C are schematic cross-sectional views illustrating various shapes of a metal pattern of a first metal pattern layer of the fan-out semiconductor package of FIG. 9 after being etched.
Figure 15B:
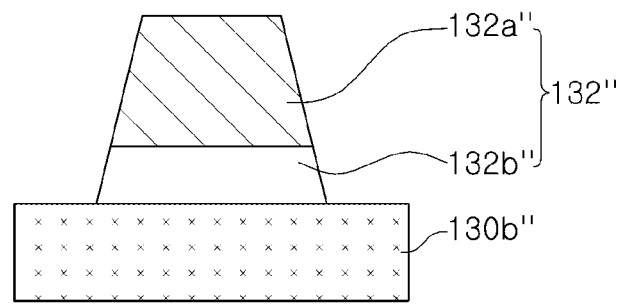
Figure 15C:
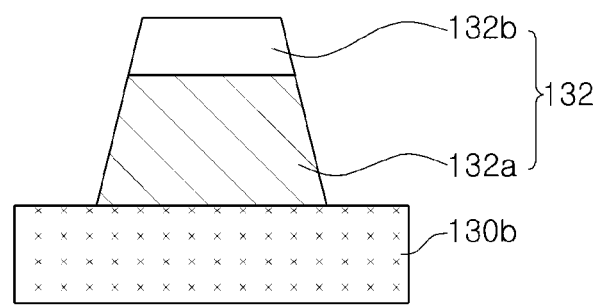

FIGS. 15A to 15C are schematic cross-sectional views illustrating various shapes of a metal pattern of a first metal pattern layer of the fan-out semiconductor package of FIG. 9 after being etched.

Referring to the drawings, it is preferable that a first metal pattern layer 132 may be disposed in a reverse form, and may be then patterned by a tenting process as described above. In this case, the first metal pattern layer 132 may have different forms of metal pattern from those by a conventional plating process. For example, as illustrated in FIG. 15A, when a metal pattern 132' is simply formed by MSAP, a seed layer 132*b*' and a plated layer 132*a*' may be sequentially disposed on a base material 130*b*', and may be formed to have approximately vertical sides. In a case of forming a metal pattern 132" simply by a tenting process, as illustrated in FIG. 15B, a seed layer 132*b*" and a plated layer 132*a*" may be sequentially disposed on a base material 130*b*". Further, the plated layer 132*a*" may be formed to have a tapered shape in which an average width of thereof is narrower than an average width of the seed layer 132*b*". When a metal pattern of a first metal pattern layer 132 is formed by a reverse tentering process as in an example, as illustrated in FIG. 15C, a first conductor layer 132*a*, which may be a plated layer, and a second conductor layer 132*b*, which may be a seed layer, may be arranged on a base material 130*b* in a reverse form. Further, the first conductor layer 132*a* as the plated layer may be formed to have a tapered shape in which an average width thereof is wider than an average width of the second conductor layer 132*b* as the seed layer. For example, the metal pattern of the first metal pattern layer 132 may have a reverse form of the seed layer and the plating layer, and may have a tapered shape in which a width of the upper surface thereof is narrower than a width of the lower surface thereof.

Figure 16:
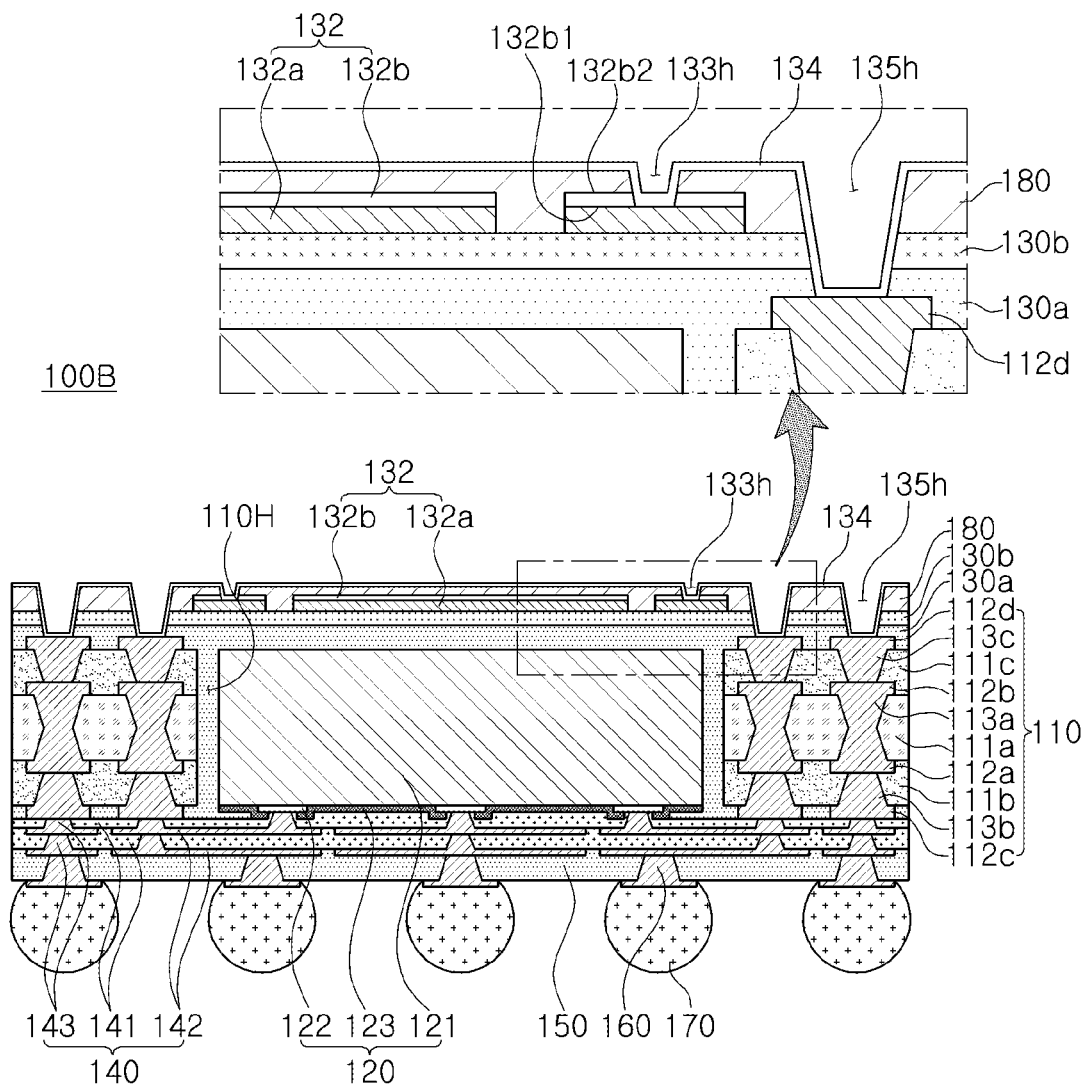
FIG. 16 is a schematic cross-sectional view illustrating another example of a fan-out semiconductor package.

FIG. 16 is a schematic cross-sectional view illustrating another example of a fan-out semiconductor package.

Referring to the drawing, a fan-out semiconductor package 100B according to another example may be different from the frame 110 in the fan-out semiconductor package 100A according to the above-described example. For example, a frame 110 may include a first insulation layer 111*a*; a first wiring layer 112*a* and a second wiring layer 112*b* respectively disposed on both surfaces of the first insulation layer 111*a*; a second insulation layer 111*b* and a third insulation layer 111*c* respectively disposed on both surfaces of the first insulation layer 111a and respectively covering the first and second wiring layers 112a and 112b; a third wiring layer 112c disposed on a side of the second insulation layer 111b, opposite to a side in which the first wiring layer 112a is embedded; a fourth wiring layer 112d disposed on a side of the third insulation layer 111c, opposite to a side in which the second wiring layer 112b is embedded; a first wiring via 113a passing through the first insulation layer 111a and electrically connecting the first and second wiring layers 112a and 112b; a second wiring via 113b passing through the second insulation layer 111b and electrically connecting first and third wiring layers 112a and 112c; and a third wiring via 113c passing through the third insulation layer 111c and electrically connecting the second and fourth wiring layers 112b and 112d. Since the frame 110 has a relatively large number of wiring layers 112a, 112b, 112c, and 112d, the connection structure 140 may be further simplified.

The first insulation layer 111a may be thicker than the second insulation layer 111b and the third insulation layer 111c. The first insulation layer 111a may be relatively thick to maintain rigidity, and the second insulation layer 111b and the third insulation layer 111c may be introduced to have a relative large number of wiring layers. In a similar manner, the first wiring via 113a passing through the first insulation layer 111a may be greater in height and average diameter than the second and third wiring vias 113b and 113c passing through the second and third insulating layers 111b and 111c. Further, the first wiring via 113a may have an hourglass or cylindrical shape, while the second and third wiring vias 113b and 113c may have tapered shapes opposite to each other. The thickness of each of the wiring layers 112a, 112b, 112c, and 112d may be thicker than the thicknesses of the redistribution layer 142. The thickness of each of the wiring layers 112a, 112b, 112c and 112d may be thicker than the thicknesses and of the first and second metal pattern layers 132 and 134, respectively.

In a fan-out semiconductor package 100B according to another embodiment, a first metal pattern layer 132 may be also electrically connected to an uppermost wiring layer 112d among wiring layers 112a, 112b, 112c, and 112d of a frame 110 only through a second metal pattern layer 134. Other details may be substantially the same as those described with reference to FIGS. 9 to 15C, and a detailed description thereof will be omitted.

Figure 17:
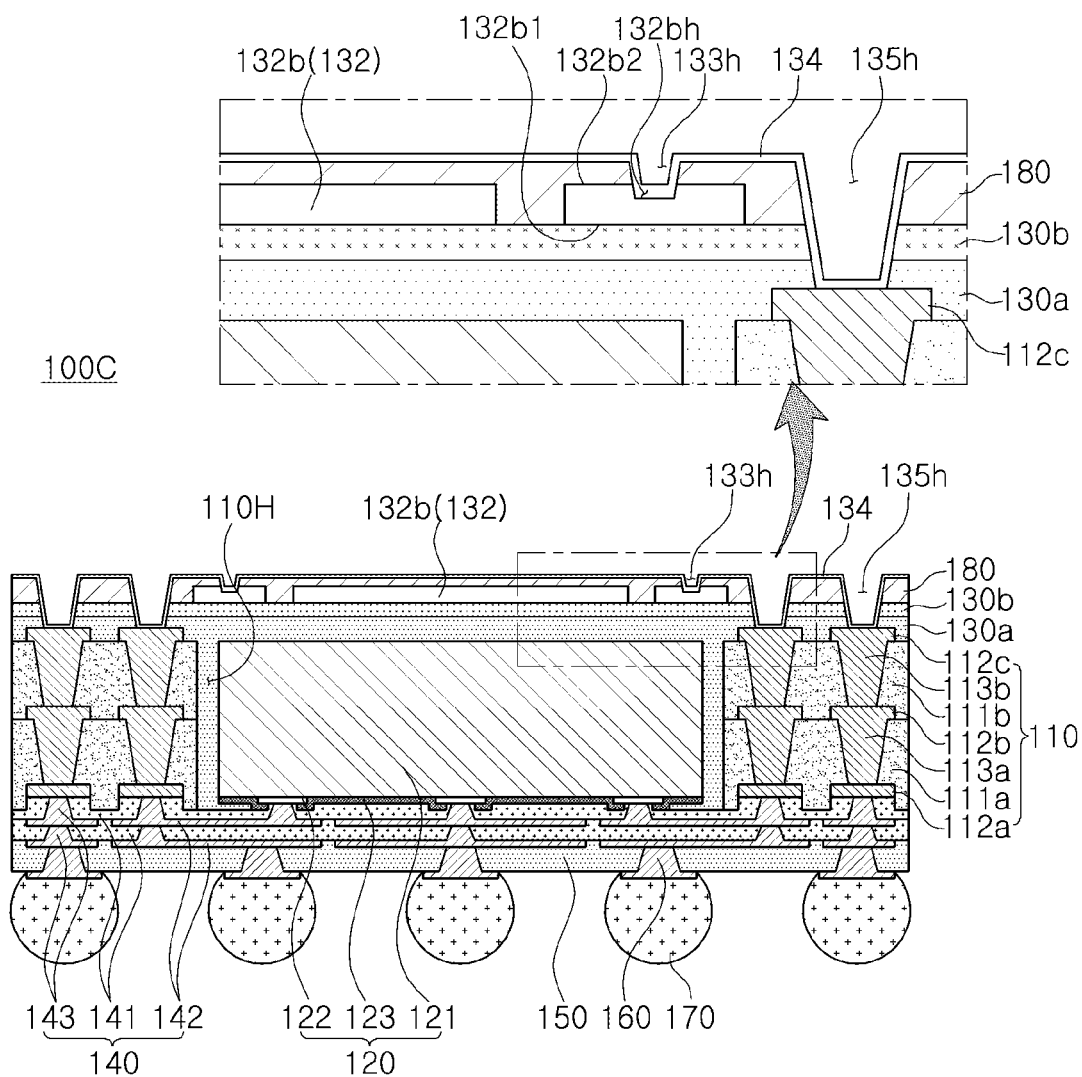
FIG. 17 is a schematic cross-sectional view illustrating an example of a fan-out semiconductor package.

FIG. 17 is a schematic cross-sectional view illustrating an example of a fan-out semiconductor package.

Referring to the drawing, a fan-out semiconductor package 100C according to another example may be different from the fan-out semiconductor package 100A according to the above-described example, in view of the fact that a first metal pattern layer 132 is formed of a single conductor layer 132b. For example, in the fan-out semiconductor package 100C according to another example, the first conductor layer 132a may be omitted, and only the second conductor layer 132b may be provided. In this case, a process may be further simplified, a thickness of the first metal pattern layer 132 may be made further thinner, and the entire thickness of the fan-out semiconductor package 100C may be made further thinner. In the conductor layer 132b, a matte surface 132b1 may be provided on a side in contact with the second encapsulant 130b and a shiny surface 132b2 may be provided on the opposite side. For example, a surface roughness of a surface of the second conductor layer 132b contacting the second encapsulant 130b may be greater than a surface roughness of the opposite surface. In this case, as described above, the pretreatment process may be performed in the carrier step or be simplified, to shorten the production time of the product. In addition, the shiny surface 132b2 may be raised in an upward direction, thereby eliminating the limitation to the pretreatment process. The first opening 133h may pass through only up to a certain depth of an upper side of the conductor layer 132b, such that the conductor layer 132b may have a recess 132bh formed by the first opening 133h. The second metal pattern layer 134 may contact a surface of the conductor layer 132b exposed by the recess 132bh, and a wall surface of the conductor layer 132b in the recess 132bh.

In a fan-out semiconductor package 100C according to another embodiment, a first metal pattern layer 132 may be also electrically connected to wiring layers 112a, 112b, and 112c of a frame 110 only through a second metal pattern layer 134. Other details may be substantially the same as those described with reference to FIGS. 9 to 16, and a detailed description thereof will be omitted.

FIGS. 18 to 21 are schematic views illustrating an example manufacturing procedure of the fan-out semiconductor package of FIG. 17.

Figure 18:
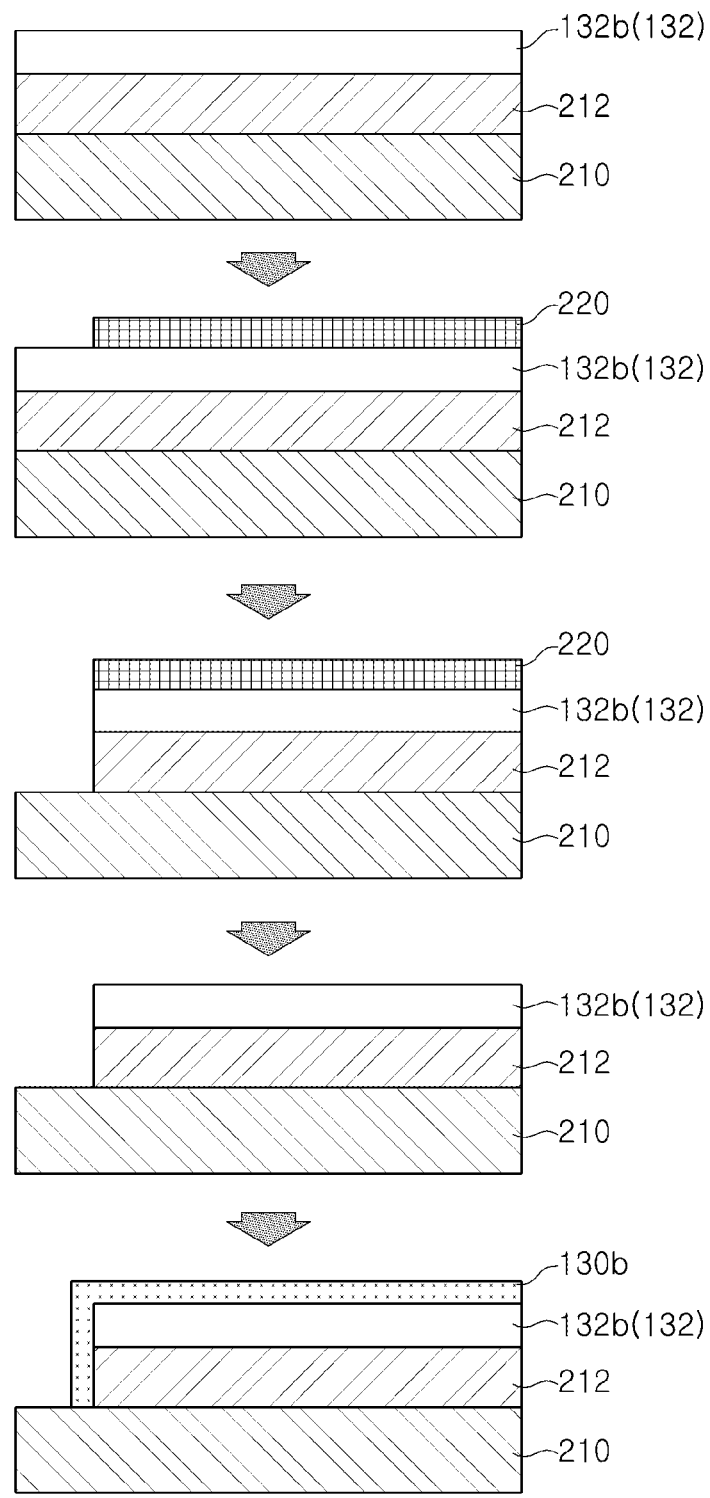
FIGS. 18 to 21 are schematic views illustrating an example manufacturing procedure of the fan-out semiconductor package of FIG. 17.

First, FIG. 18 schematically illustrates an example of a process of forming a first metal pattern layer 132 before being patterned, and a second encapsulant 130b covering the first metal pattern layer 132, using a first carrier 210.

Referring to FIG. 18, first, a first carrier 210, in which a metal layer 212 and a metal film 132b are arranged in sequence on at least one surface thereof, may be prepared. As the first carrier 210, a known copper clad laminate (CCL) or the like may be used as described above. In this case, the metal film 132b may be a one material having a considerable thickness. Therefore, it may be used as a conductor layer 132b for forming a first metal pattern layer 132, without additional electrical copper plating operation. Next, a dry film 220 may be coated on the metal film 132b, may be exposed to light, and may be developed to expose an edge portion of the metal film 132b. Next, edge portions of the metal film 132b and the metal layer 212 may be removed by an etching process. Next, the dry film 220 may be removed, and a surface of the metal film 132b may be treated with cubic zirconia (CZ) or the like. Next, a second encapsulant 130b covering the metal film 132b, and the metal layer 212 may be formed on the first carrier 210 by stacking and curing ABF or the like. The first metal pattern layer 132 before being patterned, and the second encapsulant 130b covering the first metal pattern layer 132 may be formed on the first carrier 210 through a separate process.

Figure 19:
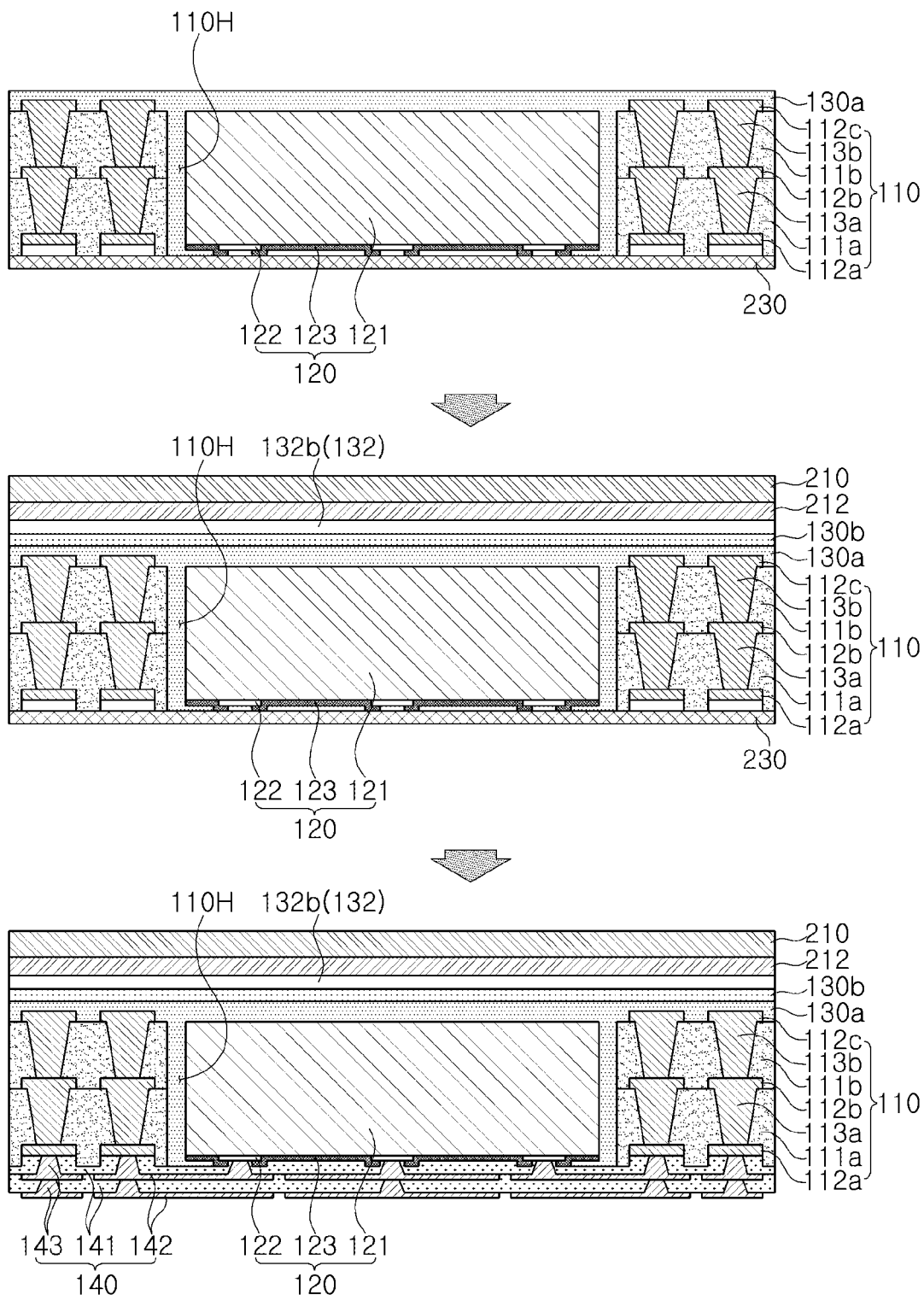
Figure 20:
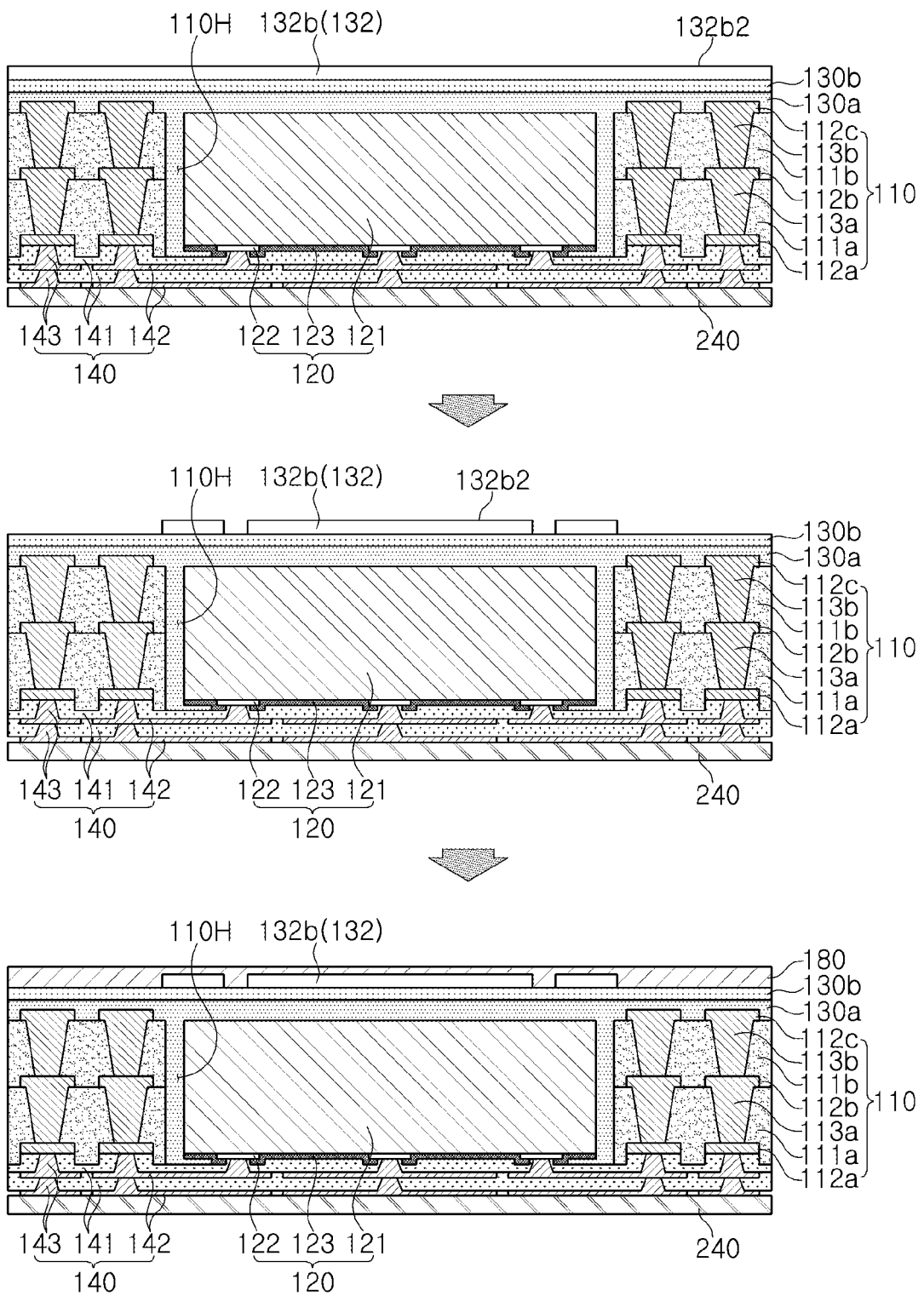
Figure 21:
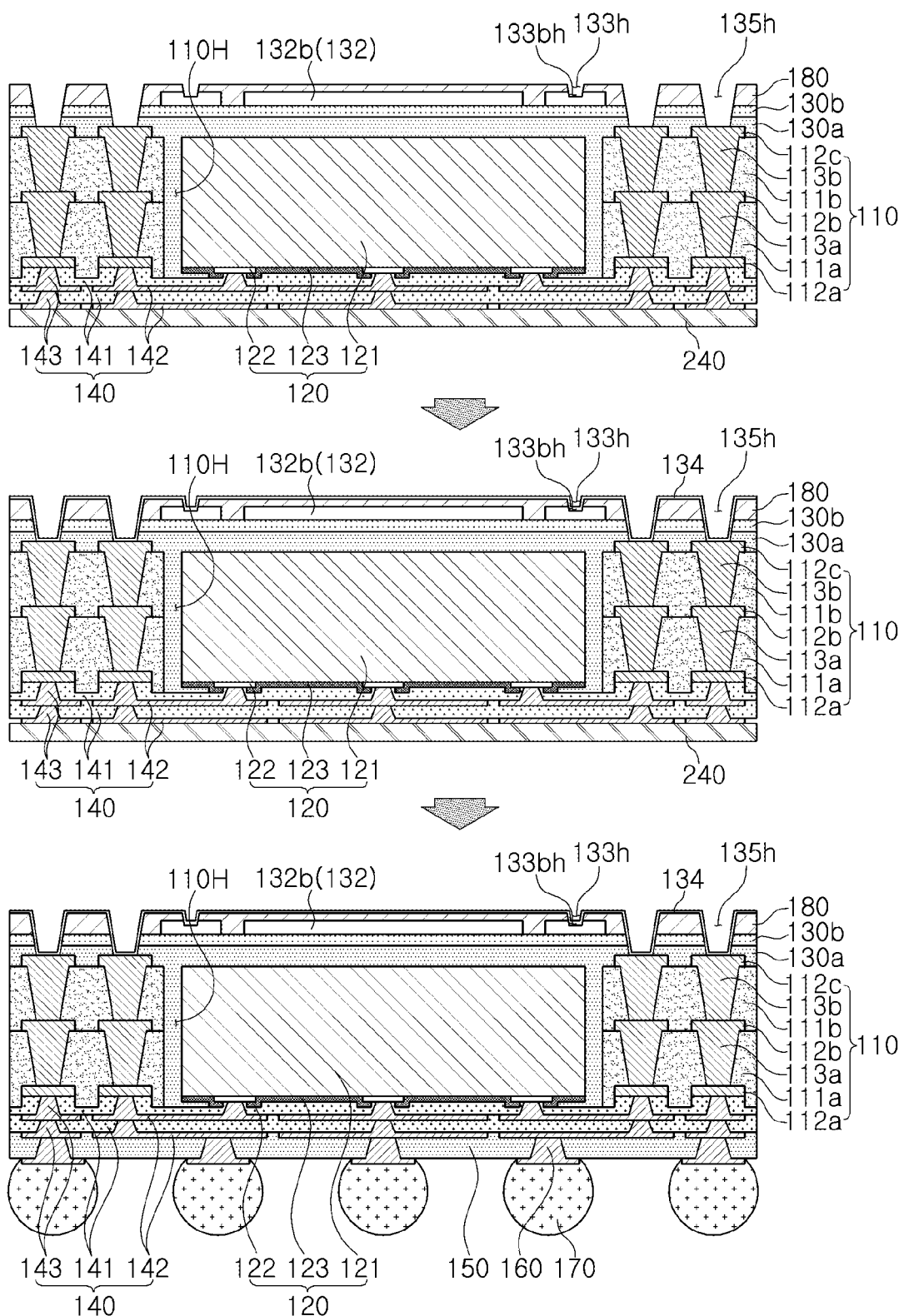

Next, FIGS. 19 to 21 schematically illustrate an example of a process of introducing a backside circuit using the first metal pattern layer 132 before being patterned and the second encapsulant 130b covering the first metal pattern layer 132, formed on the first carrier 210.

Referring to FIG. 19, a frame 110 manufactured in advance may be attached to a tape 230 or the like, a semiconductor chip 120 may be attached on the tape 230 exposed through a through-hole portion 110H of the frame 110 in a face-down manner, and they may be encapsulated with a first encapsulant 130a. Next, a first carrier 210 may be attached on the first encapsulant 130a such that a first metal pattern layer 132 before being patterned and a second encapsulant 130b covering the first metal pattern layer 132, which may be formed by a separate process as described above, may be laminated in a reverse form on the first encapsulant 130a. The first carrier 210 may perform a warpage control function during a process. Next, the tape 230 may be removed, and a connecting structure 140 may be formed in a region from which the tape 230 is removed. The connection structure 140 may be formed by repeatedly forming an insulation layer 141 using a PID or the like, forming a via hole by a photolithography process, and then forming a redistribution layer 142 and a connection via 143 by a plating process. As a plating process used, an AP, a SAP, a MSAP, a tenting process, and the like, may be used.

Referring to FIG. 20, the first carrier 210 and the metal layer 212 may be separated from the conductor layer 132b, and a second carrier 240 may be attached onto the connection structure 140. In this case, a shiny surface 132b2 of a metal film 132b may be coated with a rust-resistant component to assist a peel-off function. In another example, since the shiny surface 132b2 faces in an upward direction, such a rust-resistant component may be removed in the pretreatment process or the like. The second carrier 240 may also perform a warpage control function during a process. Next, the metal film 132b before being patterned, for example, the conductor layer 132b before being patterned, may be patterned by a tenting process to form the first metal pattern layer 132. For example, when patterning directly by the tenting process, a separate copper plating operation or the like may be unnecessary. Therefore, since application of new ABF and the like, a desmearing process, and a copper chemical process are unnecessary, the production time may be further shortened. Thereafter, the shiny surface 132b2 of the conductor layer 132b exposed in an upward direction may be pretreated with cubic zirconia (CZ) or the like. Next, ABF or the like may be stacked and cured on the second encapsulant 130b to cover the first metal pattern layer 132, to form an insulating material 180.

Referring to FIG. 21, next, a first opening 133h and a second opening 135h may be formed by a process such as using a laser drill or the like. In this case, a recess 133bh may also be formed. After the first and second openings 133h and 135h are formed, a desmearing process or the like may be performed. Next, a second metal pattern layer 134 may be formed on the insulating material 180 and on the first and second openings 133h and 135h using an electrolytic plating process or the like. Next, when the second carrier 240 is removed, and a passivation layer 150, an under bump metal 160, an electrical connection metal 170, and the like are be formed in a region from which the second carrier 240 is removed as needed, the fan-out semiconductor package 100C according to the above-described example may be manufactured. A series of processes may be performed at a relatively large panel level. In this case, a plurality of fan-out semiconductor packages 100C may be formed through the same process, and then a plurality of fan-out semiconductor packages 100C may be separately formed through a singulation process. Therefore, the productivity may be further improved.

Figure 22A:
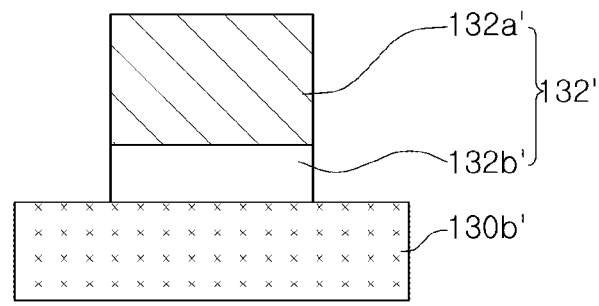
FIGS. 22 A to 22C are schematic cross-sectional views illustrating various shapes of a metal pattern of a first metal pattern layer of the fan-out semiconductor package of FIG. 17 after being etched.
Figure 22B:
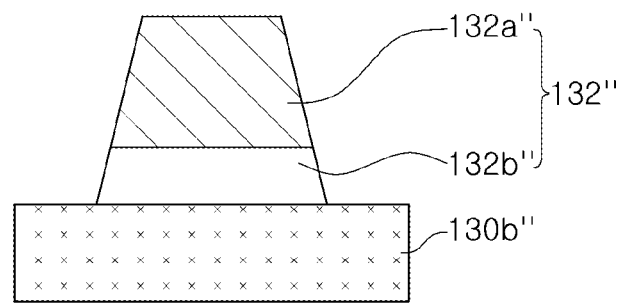
Figure 22C:
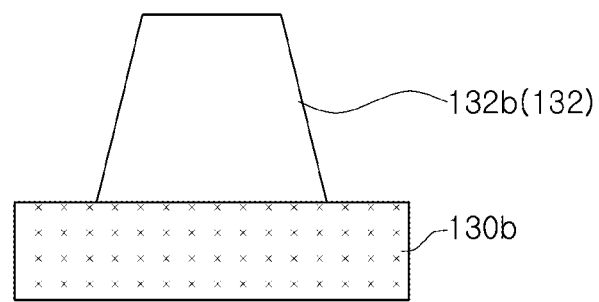

FIGS. 22A to 22C are schematic cross-sectional views illustrating various shapes of a metal pattern of a first metal pattern layer of the fan-out semiconductor package of FIG. 17 after being etched.

Referring to the drawings, it is preferable that a conductor layer 132b may be disposed in a reverse form, and a first metal pattern layer 132 may be then patterned by a tenting process as described above. In this case, the first metal pattern layer 132 may have different forms of metal pattern from those by a conventional plating process. For example, as illustrated in FIG. 22A, when a metal pattern 132' is simply formed by MSAP, a seed layer 132b' and a plated layer 132a' may be sequentially disposed on a base material 130b', and may be formed to have approximately vertical sides. In a case of forming a metal pattern 132" simply by a tenting process, as illustrated in FIG. 22B, a seed layer 132b" and a plated layer 132a" may be sequentially disposed on a base material 130b". Further, the plated layer 132a" may be formed to have a tapered shape in which an average width is narrower than an average width of the seed layer 132b". When a metal pattern of a first metal pattern layer 132 is formed by a reverse tentering process as in an example, as illustrated in FIG. 22C, a conductor layer 132b may be disposed on a base material 130b in a reverse form. Therefore, the metal pattern of the first metal pattern layer 132 may have a reverse form of a matte surface 132b1 and a shiny surface 132b2, and may have a tapered shape in which a width of the upper surface thereof is narrower than a width of the lower surface thereof.

Figure 23:
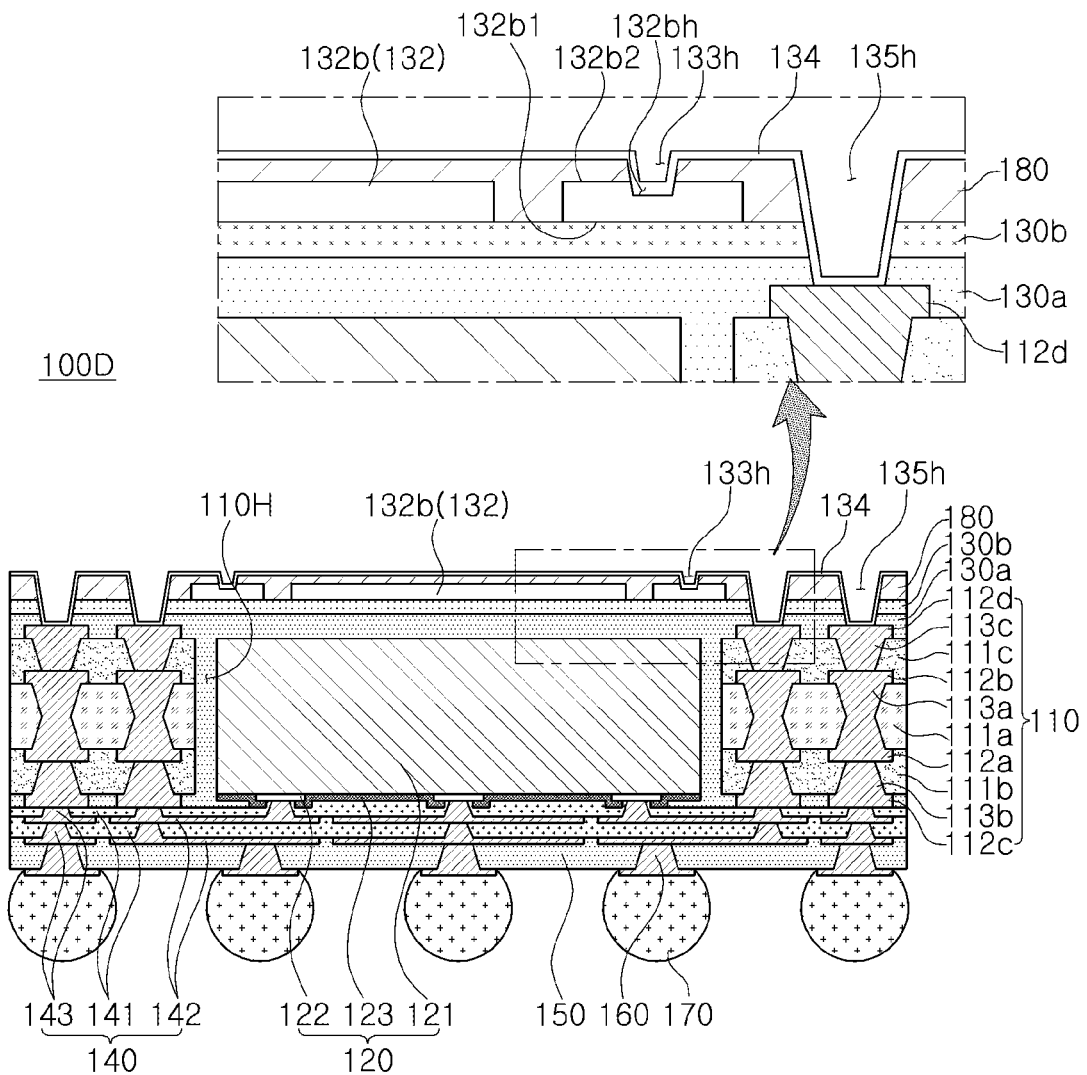
FIG. 23 is a schematic cross-sectional view illustrating another example of a fan-out semiconductor package.

FIG. 23 is a schematic cross-sectional view illustrating another example of a fan-out semiconductor package.

Referring to the drawing, a fan-out semiconductor package 100D according to another example may be different from the frame 110 in the fan-out semiconductor package 100C according to another example described above. For example, a frame 110 may include a first insulation layer 111a; a first wiring layer 112a and a second wiring layer 112b respectively disposed on both surfaces of the first insulation layer 111a; a second insulation layer 111b and a third insulation layer 111c respectively disposed on both surfaces of the first insulation layer 111a and respectively covering the first and second wiring layers 112a and 112b; a third wiring layer 112c disposed on a side of the second insulation layer 111b, opposite to a side in which the first wiring layer 112a is embedded; a fourth wiring layer 112d disposed on a side of the third insulation layer 111c, opposite to a side in which the second wiring layer 112b is embedded; a first wiring via 113a passing through the first insulation layer 111a and electrically connecting the first and second wiring layers 112a and 112b; a second wiring via 113b passing through the second insulation layer 111b and electrically connecting first and third wiring layers 112a and 112c; and a third wiring via 113c passing through the third insulation layer 111c and electrically connecting the second and fourth wiring layers 112b and 112d. Since the frame 110 has a relatively large number of wiring layers 112a, 112b, 112c, and 112d, the connection structure 140 may be further simplified.

In a fan-out semiconductor package 100D according to another embodiment, a first metal pattern layer 132 may be also electrically connected to an uppermost wiring layer 112d among wiring layers 112a, 112b, 112c, and 112d of a frame 110 only through a second metal pattern layer 134. Other details may be substantially the same as those described with reference to FIGS. 9 to 22C, and a detailed description thereof will be omitted.

In the present disclosure, the words "lower", "lower portion", "lower surface", and the like are used to refer to the downward direction (in the vertical direction of the drawings, also referred to as the thickness direction) with respect to the cross section of the drawing for convenience, while the words "upper", "upper portion", "upper surface", and the like are used to refer to a direction opposite thereto. It should be understood that, the definition of directions is for convenience of explanation, the scope of the claims is not particularly limited by the description of such directions, and the concepts of the upward/downward directions may be changed at any time.

The term of "connect" or "connection" in the present disclosure may be not only a direct connection, but also a concept including an indirect connection through an adhesive layer or the like. In addition, the term "electrically connected" or "electrical connection" means a concept including both a physical connection and a physical non-connection. Also, the expressions of "first," second," etc. are used to distinguish one component from another, and do not limit the order and/or importance of the components. In some cases, without departing from the spirit of the invention, the first component may be referred to as a second component, and similarly, the second component may be referred to as a first component.

The expression "an example embodiment" used in the present disclosure do not all refer to the same embodiment, but may be provided for emphasizing and explaining different unique features. However, the above-mentioned example embodiments do not exclude that they are implemented in combination with the features of other example embodiments. For example, although the feature in the specific example embodiment may be not described in another example embodiment, it may be understood as being related to the another example embodiment, unless otherwise described or contradicted by the another example embodiment.

The terms used in the present disclosure are used only to illustrate an example embodiment, and are not intended to limit the present disclosure. At this time, the singular expressions include plural expressions unless the context clearly dictates otherwise.

According to an aspect of the present disclosure, a fan-out semiconductor package having a backside circuit, yet capable of shortening production time of a product, controlling plating quality of the same, eliminating a limitation to pretreatment of the same, and thinning a thickness of the same may be provided.

While examples have been shown and described above, it will be apparent to those skilled in the art that modifications and variations could be made without departing from the scope of the present disclosure as defined by the appended claims.

What is claimed is:

1. A fan-out semiconductor package comprising:
    a connection structure including one or more redistribution layers;
    a frame disposed on the connection structure, including one or more wiring layers and having a through-hole portion;
    a semiconductor chip disposed in the through-hole portion on the connection structure and having a connection pad electrically connected to the one or more redistribution layers;
    an encapsulant disposed on the connection structure and covering at least a portion of each of the frame and the semiconductor chip;
    a first metal pattern layer disposed on a portion of the encapsulant that is interposed between the semiconductor chip and the first metal pattern layer;
    an insulating material disposed on the encapsulant and covering the first metal pattern layer;
    a first opening passing through the insulating material and exposing a portion of the first metal pattern layer;
    a second opening passing through the encapsulant and the insulating material and exposing a portion of an uppermost wiring layer among the one or more wiring layers; and
    a second metal pattern layer disposed on the insulating material, and extending to the first and second openings and connected to the exposed first metal pattern layer and the exposed uppermost wiring layer, respectively.

2. The fan-out semiconductor package according to claim 1, wherein the first metal pattern layer is electrically connected to the uppermost wiring layer only through a path via the second metal pattern layer.

3. The fan-out semiconductor package according to claim 1, wherein the first metal pattern layer comprises one or more metal patterns, and
    wherein each of the one or more metal patterns has a tapered shape in which an upper surface width thereof is narrower than a lower surface width thereof.

4. The fan-out semiconductor package according to claim 1, wherein the encapsulant comprises a first encapsulant disposed on the connection structure, covering at least a portion of each of the frame and the semiconductor chip, and filling at least a portion of the through-hole portion; and a second encapsulant covering the first encapsulant,
    the first and second encapsulants are distinct layers distinguished from each other by a boundary, and
    the first metal pattern layer and the insulating material are disposed on the second encapsulant.

5. The fan-out semiconductor package according to claim 1, wherein the second metal pattern layer is disposed in a conformal via shape to have a constant thickness along a wall surface of each of the first and second openings.

6. The fan-out semiconductor package according to claim 1, wherein a height of the second opening is greater than a height of the first opening, and
    a distance of a major axis of a cut surface of the second opening is longer than a distance of a major axis of a cut surface of the first opening on any level, when the first and second openings are cut in the same plane.

7. The fan-out semiconductor package according to claim 1, wherein the semiconductor chip has an active surface on which the connection pad is disposed, and an inactive surface opposite to the active surface, and
    the active surface contacts the connection structure.

8. The fan-out semiconductor package according to claim 1, wherein the frame comprises a first insulation layer in contact with the connection structure; a first wiring layer in contact with the connection structure and embedded in the first insulation layer; a second wiring layer disposed on a side of the first insulation layer, opposite to a side in which the first wiring layer is embedded; a second insulation layer disposed on the first insulation layer and covering the second wiring layer; and a third wiring layer disposed on a side of the second insulation layer, opposite to a side in which the second wiring layer is embedded,
    wherein the one or more wiring layers comprises the first to third wiring layers, and
    wherein the first to third wiring layers are electrically connected to the connection pad.

9. The fan-out semiconductor package according to claim 1, wherein the frame comprises a first insulation layer; first and second wiring layers respectively disposed on both surfaces of the first insulation layer; second and third insulation layers respectively disposed on the both surfaces of the first insulation layer and respectively covering the first and second wiring layers; a third wiring layer disposed on a side of the second insulation layer, opposite to a side in which the first wiring layer is embedded; and a fourth wiring layer disposed on a side of the third insulation layer, opposite to a side in which the second wiring layer is embedded,
    wherein the one or more wiring layers comprise the first to fourth wiring layers, and
    wherein the first to fourth wiring layers are electrically connected to the connection pad.

10. A fan-out semiconductor package comprising:
- a connection structure including one or more redistribution layers;
- a frame disposed on the connection structure, including one or more wiring layers and having a through-hole portion;
- a semiconductor chip disposed in the through-hole portion on the connection structure and having a connection pad electrically connected to the one or more redistribution layers;
- an encapsulant disposed on the connection structure and covering at least a portion of each of the frame and the semiconductor chip;
- a first metal pattern layer disposed on the encapsulant;
- an insulating material disposed on the encapsulant and covering the first metal pattern layer;
- a first opening passing through the insulating material and exposing a portion of the first metal pattern layer;
- a second opening passing through the encapsulant and the insulating material and exposing a portion of an uppermost wiring layer among the one or more wiring layers; and
- a second metal pattern layer disposed on the insulating material, and extending to the first and second openings and connected to the exposed first metal pattern layer and the exposed uppermost wiring layer, respectively,
- wherein the first metal pattern layer comprises a first conductor layer disposed on the encapsulant and a second conductor layer disposed on the first conductor layer, and
- wherein a thickness of the first conductor layer is greater than a thickness of the second conductor layer.

11. The fan-out semiconductor package according to claim 10, wherein a surface roughness of a surface of the second conductor layer in contact with the first conductor layer is greater than a surface roughness of a surface opposite to the surface of the second conductor layer in contact with the first conductor layer.

12. The fan-out semiconductor package according to claim 10, wherein the first opening passes through the second conductor layer to expose the first conductor layer.

13. The fan-out semiconductor package according to claim 12, wherein the second metal pattern layer is in direct contact with the first conductor layer.

14. The fan-out semiconductor package according to claim 1, wherein the first metal pattern layer is consisted of one conductor layer.

15. The fan-out semiconductor package according to claim 14, wherein a surface roughness of a surface of the one conductor layer in contact with the encapsulant is greater than a surface roughness of a surface opposite to the surface of the one conductor layer in contact with the encapsulant.

16. The fan-out semiconductor package according to claim 14, wherein the one conductor layer has a recess formed by the first opening.

17. A fan-out semiconductor package comprising:
- a connection structure including one or more redistribution layers;
- a semiconductor chip disposed on the connection structure and having connection pads electrically connected to the one or more redistribution layers;
- an electrical connection member disposed on the connection structure, and electrically connected to the one or more redistribution layers to provide a vertical electrical connection path;
- an encapsulant disposed on the connection structure and covering at least a portion of each of the semiconductor chip and the electrical connection member;
- a first metal pattern layer disposed on a portion of the encapsulant that is interposed between the semiconductor chip and the first metal pattern layer;
- an insulating material disposed on the encapsulant and covering the first metal pattern layer;
- a first opening passing through the insulating material and exposing a portion of the first metal pattern layer;
- a second opening passing through the encapsulant and the insulating material and exposing a portion of the electrical connection member; and
- a second metal pattern layer disposed on the insulating material, and extending to the first and second openings and connected to the exposed first metal pattern layer and the exposed electrical connection member, respectively.

18. The fan-out semiconductor package according to claim 17, wherein the first metal pattern layer comprises a first conductor layer disposed on the encapsulant and a second conductor layer disposed on the first conductor layer, and
wherein a thickness of the first conductor layer is greater than a thickness of the second conductor layer.

19. The fan-out semiconductor package according to claim 18, wherein a surface roughness of a surface of the second conductor layer in contact with the first conductor layer is greater than a surface roughness of a surface opposite to the surface of the second conductor layer in contact with the first conductor layer.

20. The fan-out semiconductor package according to claim 17, wherein the first metal pattern layer comprises one or more metal patterns, and
wherein each of the one or more metal patterns has a tapered shape in which an upper surface width thereof is narrower than a lower surface width thereof.

* * * * *